US007428311B2

(12) United States Patent
Curran et al.

(10) Patent No.: US 7,428,311 B2
(45) Date of Patent: Sep. 23, 2008

(54) METHOD AND APPARATUS FOR BOOSTING AN AUDIBLE SIGNAL IN A NOTIFICATION SYSTEM

(75) Inventors: John W. Curran, Lebanon, NJ (US); Edward V. Applegate, Temecula, CA (US); Joseph Kosich, South Toms River, NJ (US); Richard H. Fetterly, Jackson, NJ (US); Anthony W. Russo, II, Red Bank, NJ (US); Brian E. Bizjak, Bridgewater, NJ (US)

(73) Assignee: Wheelock, Inc., Long Branch, NJ (US)

( * ) Notice: Subject to any disclaimer, the term of this patent is extended or adjusted under 35 U.S.C. 154(b) by 1027 days.

(21) Appl. No.: 10/323,875

(22) Filed: Dec. 19, 2002

(65) Prior Publication Data

US 2003/0169177 A1 Sep. 11, 2003

Related U.S. Application Data

(60) Provisional application No. 60/342,226, filed on Dec. 19, 2001, provisional application No. 60/381,605, filed on May 17, 2002.

(51) Int. Cl.
*H03F 21/00* (2006.01)

(52) U.S. Cl. .................. 381/120; 340/506; 340/286.02; 340/291

(58) Field of Classification Search ................. 381/120, 381/82, 84, 77, 79; 340/311.2, 506, 326, 340/286.02, 286.03, 286.11, 286.12, 291, 340/328
See application file for complete search history.

(56) References Cited

U.S. PATENT DOCUMENTS

| | | | | |
|---|---|---|---|---|
| 4,375,637 A * | 3/1983 | Desjardins | .................. | 340/517 |
| 4,881,058 A * | 11/1989 | Berry, III | .................... | 340/326 |
| 5,887,067 A * | 3/1999 | Costa et al. | ................... | 381/81 |

* cited by examiner

*Primary Examiner*—Vivian Chin
*Assistant Examiner*—Con P Tran

(57) ABSTRACT

The present invention is an apparatus and a concomitant method for boosting the audio signal generated by at least one notification appliance in a supervised emergency voice evacuation system.

36 Claims, 32 Drawing Sheets

3A 3B 3A 3B

PBA-160
160 WATT
AUDIO BOOSTER

POWER BOOSTER STROBE & CONTROL CIRCUIT

DIGITAL VOICE OUTPUT CIRCUIT
(SP40/2)

NOTES: (UNLESS OTHERWISE SPECIFIED)
1. ALL RESISTANCE IS IN OHMS
2. ALL RESISTORS ARE 1/4W, 5%
3. ALL CAPACITANCE IS IN MICRO FARADS

NOTES: (UNLESS OTHERWISE SPECIFIED)
1. ALL RESISTANCE IS IN OHMS
2. ALL RESISTORS ARE 1/3W, 5%
3. ALL CAPACITANCE IS IN MICRO FARADS

DIGITAL VOICE INPUT CIRCUIT (SP40/2)

AUDIO OUTPUT CIRCUIT
(SP40/2)

NOTES: (UNLESS OTHERWISE SPECIFIED)
1. ALL RESISTANCE IS IN OHMS
2. ALL RESISTORS ARE 1/4W, 5%
3. ALL CAPACITANCE IS IN MICRO FARADS

AUXILIARY INPUT CIRCUIT
(SP40/2)

POWER SUPPLY BATTERY CHARGER (SP40/2)

STROBE CIRCUIT (SP40/2)

AMPLIFIER CIRCUIT (SP40/2)

MICROPHONE PRE - AMP CIRCUIT
(SP40/2)

NOTES: (UNLESS OTHERWISE SPECIFIED)
1. ALL RESISTANCE IS IN OHMS
2. ALL RESISTORS ARE 1/4W, 5%
3. ALL CAPACITANCE IS IN MICRO FARADS

MICRO CONTROLLER CIRCUIT (SP40/2)

TONE GENERATOR CIRCUIT (SP40/2)

NOTES: (UNLESS OTHERWISE SPECIFIED)
1. ALL RESISTANCE IS IN OHMS
2. ALL RESISTORS ARE 1/8W, 5%
3. ALL CAPACITANCE IS IN MICRO FARADS

BGM/TEL CIRCUIT (SP40/2)

STATUS CIRCUIT (SP40/2)

NOTES: (UNLESS OTHERWISE SPECIFIED)
1. ALL RESISTANCE IS IN OHMS
2. ALL RESISTORS ARE 1/4W, 5%
3. ALL CAPACITANCE IS IN MICRO FARADS

AUDIO MIXER
(SP40/2)

GND FAULT CIRCUIT (SP40/2)

NOTES: (UNLESS OTHERWISE SPECIFIED)
1. ALL RESISTANCE IS IN OHMS
2. ALL RESISTORS ARE 1/4W, 5%
3. ALL CAPACITANCE IS IN MICRO FARADS

NOTES(UNLESS OTHERWISE SPECIFIED)
1. ALL RESISTANCE IS IN OHMS
2. ALL RESISTORS ARE 1/4W, 5%
3. ALL CAPACITANCE IS IN MICRO FARADS

AUDIO BOOSTER POWER CIRCUITS
(SPB - 160)

160 WATT
AUDIO BOOSTER
(SPB-160)

160 WATT
AUDIO BOOSTER
(SPB-160)

CONTROL + MISC CIRCUITS (SPB-160)

METHOD AND APPARATUS FOR BOOSTING AN AUDIBLE SIGNAL IN A NOTIFICATION SYSTEM

This application claims the benefit of U.S. Provisional Applications No. 60/342,226 filed on Dec. 19, 2001 and No. 60/381,605 filed on May 17, 2002, which are herein incorporated by reference.

The present invention relates to an apparatus and concomitant method for boosting an audible signal in a notification system. More specifically, the present invention provides an audio power booster to boost the audio signal generated by at least one notification appliance in a supervised emergency voice evacuation system.

BACKGROUND OF THE DISCLOSURE

An emergency notification system for a facility is often designed to drive a certain number of notification appliances, e.g., audio notification appliances, visual notification appliances and both audio and visual notification appliances. In operation, an amplifier is often deployed within a centralized panel, e.g., a fire voice evacuation panel, to achieve this capability.

However, if the facility is expanded such that additional notification appliances are added to the overall emergency notification system, the amplifier may not be capable of performing its functions in a reliable manner. Often it is necessary to modify or upgrade the panel if the added notification appliances exceed the capability of the amplifier. This is a costly modification and may require an extensive period of time where the emergency notification system is inactivated to allow the modification to be made, which is undesirable for safety reasons.

Thus, there is a need for an apparatus and concomitant method for boosting a signal, e.g., an audible signal and/or a power signal, in a notification system.

SUMMARY OF THE INVENTION

The present invention is an apparatus and a concomitant method for boosting a signal, e.g., an audio signal and/or a power signal, generated by at least one notification appliance in a supervised emergency voice evacuation system. The present invention deploys an audio booster within a notification system such that notification appliances attached after the audio booster will receive power from the audio booster, whereas notification appliances before the audio boosters receiver power from the amplifier in the panel. This novel approach allows the "loop" of the notification system to be extended without having to modify the panel.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
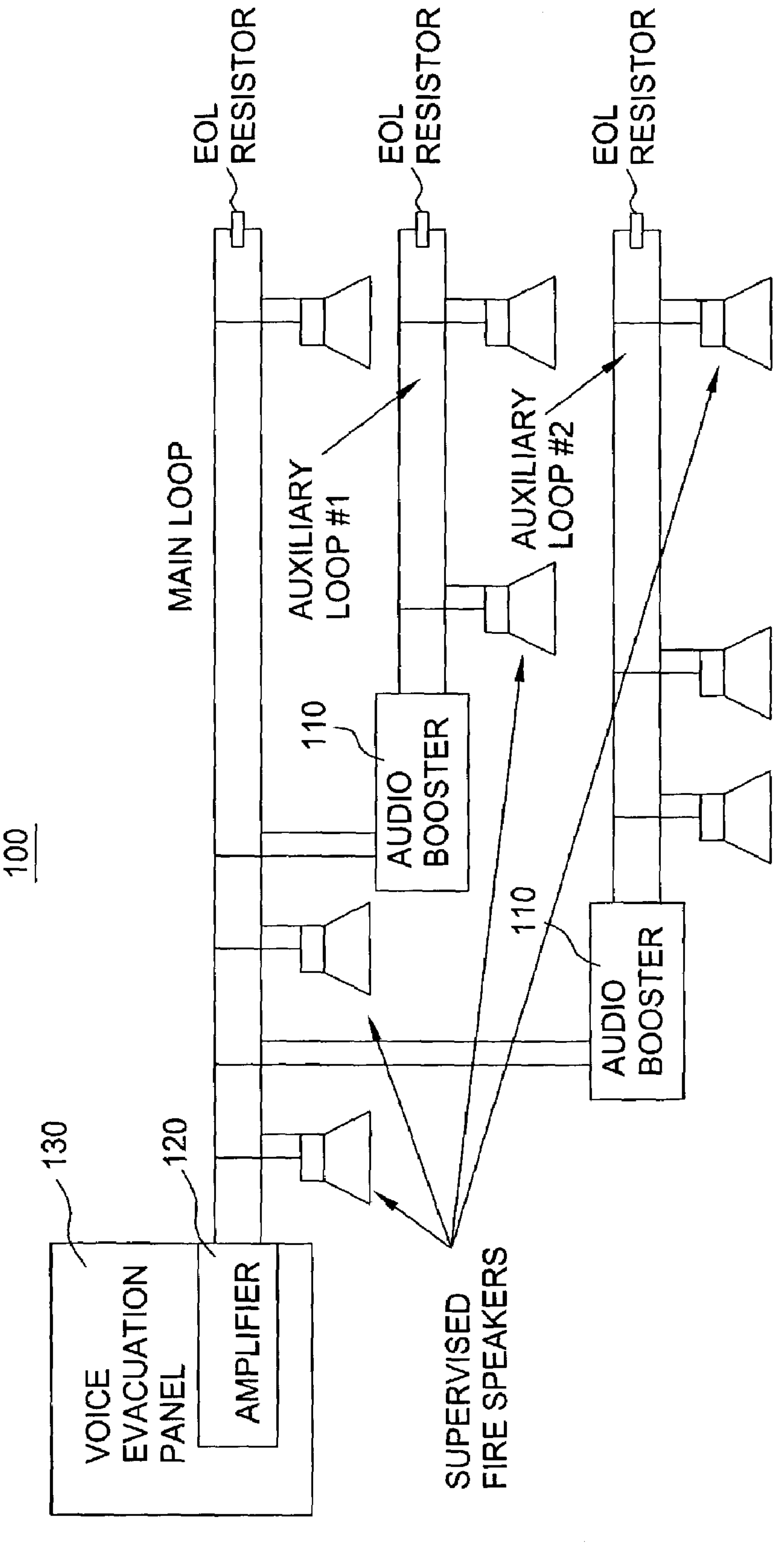
FIG. 1 illustrates a block diagram of a supervised emergency voice evacuation system of the present invention.

FIG. 1 illustrates a block diagram of a supervised emergency voice evacuation system or a supervised notification system of the present invention. The basic concept of the present invention is to provide an amplification to audio (e.g., voice) applications in an evacuation system by the use of an audio booster 110. This booster could be attached at any point along a speaker circuit, appearing to the Fire Voice Evacuation Panel amplifier or pre-amplifier 120 driving the circuit as a fire speaker.

A supervised emergency voice evacuation system relates to a system where amplifiers within the notification system are monitored for failures or trouble conditions. For example, the audio boosters 110 of the present invention are "supervised".

In one present embodiment, each booster could provide 80 or 160 Watts of additional audio power to the original power available from the Voice Evacuation Panel 130. The boosters would supervise their respective lines using the monitoring circuit as disclosed in U.S. patent application entitled "Method And Apparatus For Supervising An Audio Circuit With Continuous Audio", filed on Jul. 19, 2000 with Ser. No. 09/619,544, which is herein incorporated by reference. If a trouble condition were determined (either a short, ground or open) the booster would change its input characteristics. This would look like an open to the Voice Evacuation Panel indicating a trouble condition somewhere on the overall speaker circuit.

The audio booster 110 appears to be like a Notification Appliance to the fire panel, i.e., drawing almost no current. When attached to a Notification Appliance loop, they allow the loop to be extended with additional Notification Appliance units. The fire panel provides the power to those appliances which are attached before the booster, whereas the booster provides power to those appliances attached after the booster. When the fire panel goes into alarm, the booster senses the change in polarity on the loop and turns on its own loop(s). It should be noted that "T" tapping is typically not preferred. In practice, the audio boosters 110 and the notification appliances are deployed along the main loop, i.e., two wires coming from a previous device and two wires going to the next device and so on. However, for illustration purposes, these audio boosters 110 in FIG. 1 are shown below the main loop to illustrate that they are providing power to auxiliary Loops 1 and 2.

In two embodiments, the audio boosters are implemented to provide 80 or 160 Watts of additional audio power. Those skilled in the art will realize that audio boosters with other wattages can be implemented in view of the present disclosure. Thus, the specifications for the PBA-80 (or SPB-80) and PBA-160 (or SPB-160) as presented below are only illustrative of the present invention.

In one embodiment, the (PBA-80) power booster/amplifier incorporates an 80-watt amplifier with 25 or 70 V output (100 V for export) and 4 amps of synchronized NAC strobe power. In a second embodiment, the (PBA-160) power booster/amplifier incorporates two 80-watt amplifiers with 25 or 70 V output (100 V for export). Additional power amplifier/boosters can be added via input and output loops to accommodate larger system requirements. Additional zone splitters can be added to divide the amplifier into additional speaker zones. System has battery backup.

The PBA-80 and PBA-160 Emergency Voice Evacuation Audio Power Amplifier (and synchronized NAC Strobe power booster—PBA-80), can be deployed for use in fire, emergency and non-fire: BGM and paging applications. The amplifiers can be connected to any SafePath™ or Voice-Evac™ panel of Wheelock Inc. to increase the system audio/synchronized NAC Strobe power requirements. Up to 100 systems can be added to any SafePath or VoiceEvac panel offering up to:

PBA-80 8,000 watts of supervised audio power and 400 amps of synchronized 24 VDC NAC circuit power PBA-160 16,000 watts of supervised audio power The power boosters can be powered by 120 VAC (240 VDC option available for export) and have 24 VDC battery back up capabilities. Batteries can be mounted within the cabinet. The power boosters shall be capable of audio supervision during BGM. The power boosters are capable of delivering intelligible voice reproduction. The present system can be deployed in markets such as OSHA related installations, restaurants, franchised national restaurants, educational facilities, institutional facilities, offices/warehouses, plants, retail establishments, hotels & motels, and churches & synagogues (Houses of Worship). The system is designed for new construction as well as for retrofit construction.

The present invention provides various features or functionalities, but the present invention is not so limited. Namely, the list of features, functionalities and specifications below is only illustrative of the present invention.

It allows units to be connected together for expandability and to provide additional audio power and synchronized Strobe NAC power as required.

When the system is activated via an alarm condition, all non-emergency operations shall be disengaged from the system. This will also minimize secondary power supply requirements (battery current draw).

Preset audio levels can be set for Emergency messaging (prerecorded and live mic)—system to revert back to a pre set level regardless of the volume set for general paging and BGM.

The emergency/fire message shall follow requirements as specified in a particular implementation.

Battery charging capabilities are designed to meet various standards, e.g., NFPA-72 (1999) battery charging requirements section 1-5.2.9.2 (page 72-22)

It has the ability to connect to speaker splitter modules.

Amplifier Specifications:

Use of the SafePath supervised 80 watt amplifier design can be incorporated.

- Fully supervised circuitry always in effect—even during BGM.
- Switch mode class-D amplifier.
- Power limited circuitry.
- Speaker outputs: 70 V, 25 V (100V available for export).
- Frequency Response: Voice 275 Hz—6.5 kHz +/−2.4 dB (UL 864, UL1480). BGM: 100 Hz—15 kHz +/−2.4 dB.
- Signal to Noise Ratio: better than 65 dB.
- (Difference between the nominal level and the noise floor, the higher the better)
- Dynamic range: better than 65 dB.
- (Difference between the loudest and quietest portions of the program signal, the higher the better)
- Total Harmonic Distortion: less than 1%.
- Note: A weighted filter enabled Ability to expand by connecting additional systems via 25 or 70 volt inputs and outputs (100 V for export).

- Shall be compatible with all SafePath models.
- On board In/Out loop for connection of an EQ, limiter, processors, etc.

Synchronized NAC Strobe Specifications:

All synchronized NAC Strobe specifications are to be the same as other Wheelock synchronized NAC Strobe specifications.

Power Supply/Charger Specifications:

Use of the 200 watt supply being incorporated in the 8 amp power booster and VoiceEvac-40.

Inputs—Audio:

Screw terminal inputs.

Auxiliary input (70 volt/1V) (100V for export).

Telephone input.

Terminals to accept 18 gauge solid wire.

Outputs:

25/70 volt audio output (100 V for export).

24 VDC NAC output.

Terminals to accept 18 gauge solid wire.

Preset volume and frequency setting for fire/emergency use.

Controls:

Large buttons/switches clearly labeled.

For Voice Evacuation: (tone and volume preset as per code).

For BGM and Paging: Independent volume and tone—(bass and treble) controls—these controls can be a board mounted potentiometer.

Diagnostics:

Multiple LEDS for easy indication of system diagnostic conditions.

Indication label mounted on inside door panel (for easy reference).

Supervision LED indicator on panel.

Field replaceable fuses shall be incorporated where overload may occur in accordance with UL.

General:

No supervisory/system tones shall be heard through the amplifier-operation is to be silent.

Internal battery charger-power supply.

Quick connect/disconnect terminal plugs.

Options:

Export version (240V) with 100 V audio output amplifiers.

Figure 2:
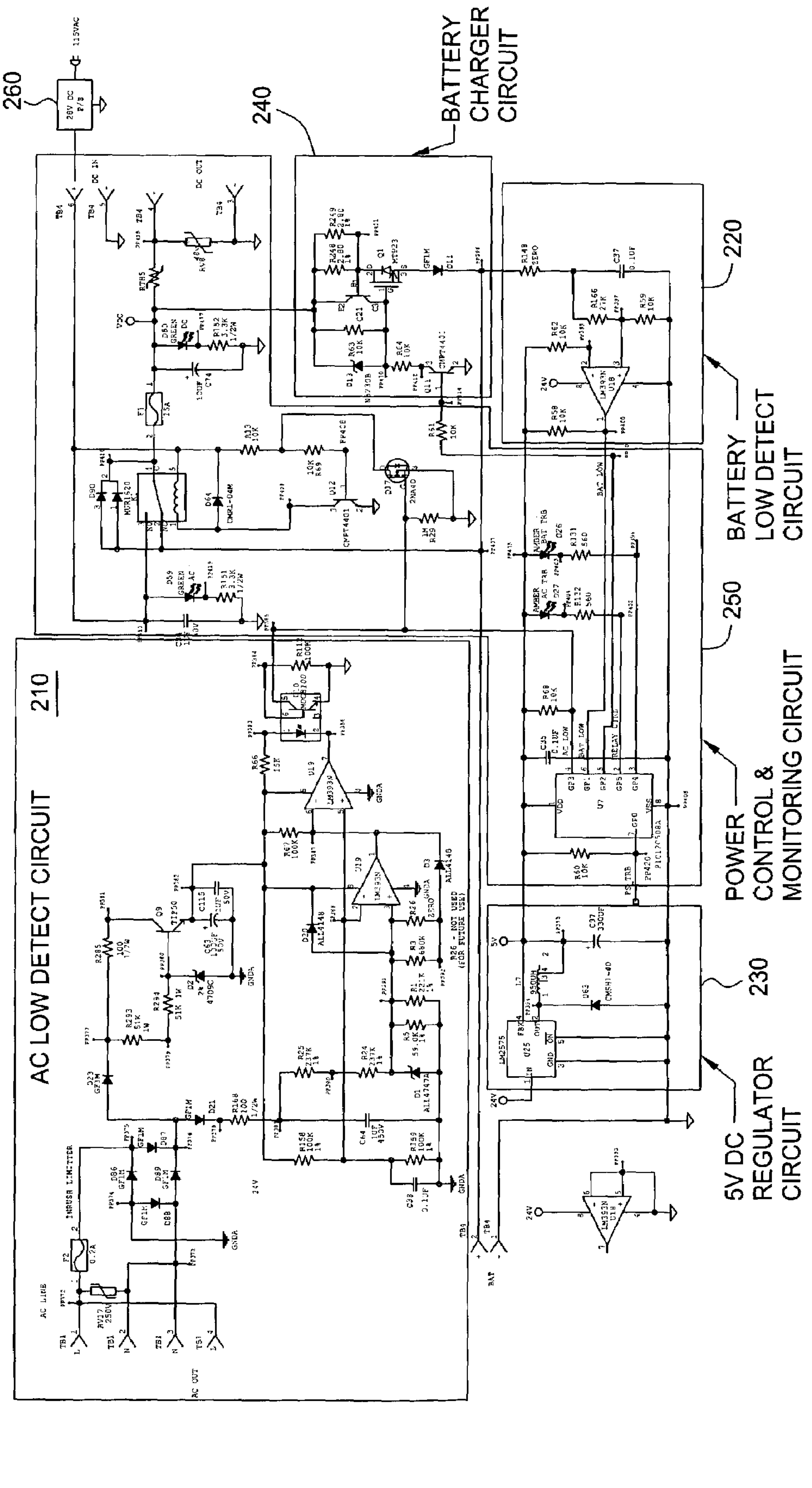
FIG. 2 illustrates a schematic diagram of a power booster battery charger of the present invention.

FIG. 2 illustrates a schematic diagram of a power booster battery charger 200 of the present invention. The power booster battery charger 200 comprises an AC low detect circuit 210, a battery low detect circuit 220, a 5 VDC regulator circuit 230, a battery charger circuit 240, and a power control & monitoring circuit 250. The present design also utilizes an Off-Line switching power supply (a DC power supply 260) that converts AC Line power to 27-28 Vdc that can power the amplifier and support circuitry.

Specifically, AC low detect circuit 210 takes the AC Line voltage, rectifies it and compares the level to a reference. If the level is in the normal range above the reference, the optocoupler on the output is switched ON to signal that AC Line is NORMAL. If the AC Line happens to be lower than the reference level or OFF, than the output optocoupler will be OFF signaling that AC is LOW.

Battery low detect circuit 220 ensures that a battery is installed and meets a minimum voltage requirement determined by a reference level set by the 5 Vdc Regulator Circuit through resistor R62. The battery level must be greater than 18.5 Vdc to be recognized by this circuit as NORMAL. If the battery is lower or not present, comparator U18 will signal that a Battery LOW condition exists.

5 VDC regulator circuit 230 provides a precise 5 Vdc level/power to any circuit within the booster that requires it. In this design, a switch mode dc to dc convertor was used to provide the needed power while remaining much cooler (than a linear regulator).

Battery charger circuit 240 uses the regulated voltage from the DC POWER SUPPLY (27-28 Vdc) to charge the batteries (12V×2). It feeds the voltage directly to the batteries but limits the current to approximately 0.5 amps. If the batteries are drained, the batteries will pull the full 0.5 amps. As the batteries reach full charge, the current will fall to a much lower level (trickle-charge). An ON/OFF capability is provided to allow the microcontroller U7 to turn OFF the charger while doing the Battery Low test.

The power control and monitoring circuit 250 employs a microcontroller U7 that is used to monitor and control power into the booster. If AC is LOW or failed, LED D27 "AC TRB" is illuminated and power is derived from Battery through relay K1 and diode D90. If Battery is LOW or failed, LED D26 "BAT TRB" is illuminated and power drawn from the DC POWER SUPPLY (through relay K1) powered by the AC Line.

Figure 3:
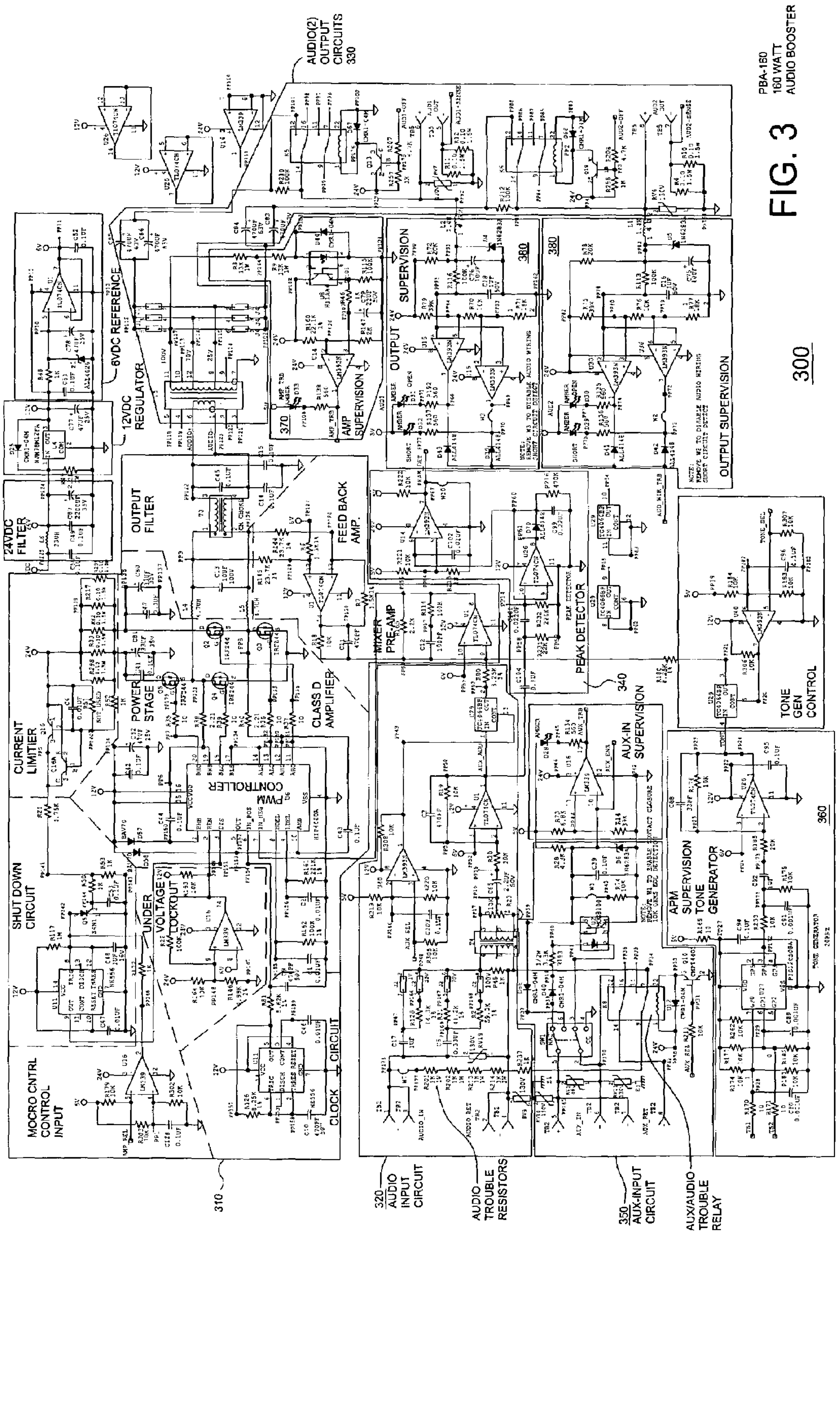
FIG. 3 illustrates a schematic diagram of a 160 watt audio booster of the present invention.
Figure 3A:
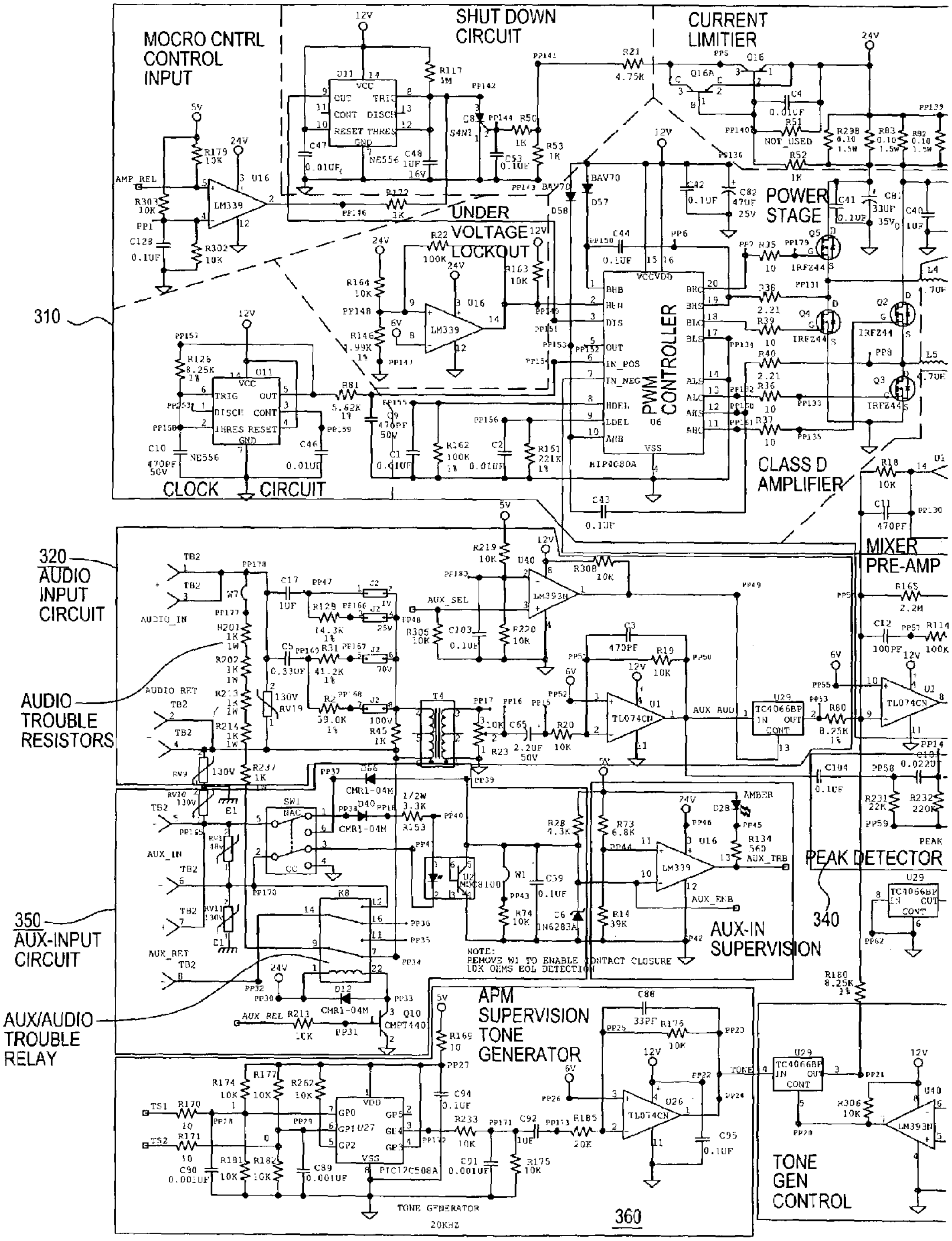
FIGS. 3A and 3B are magnified views of FIG. 3.
Figure 3B:
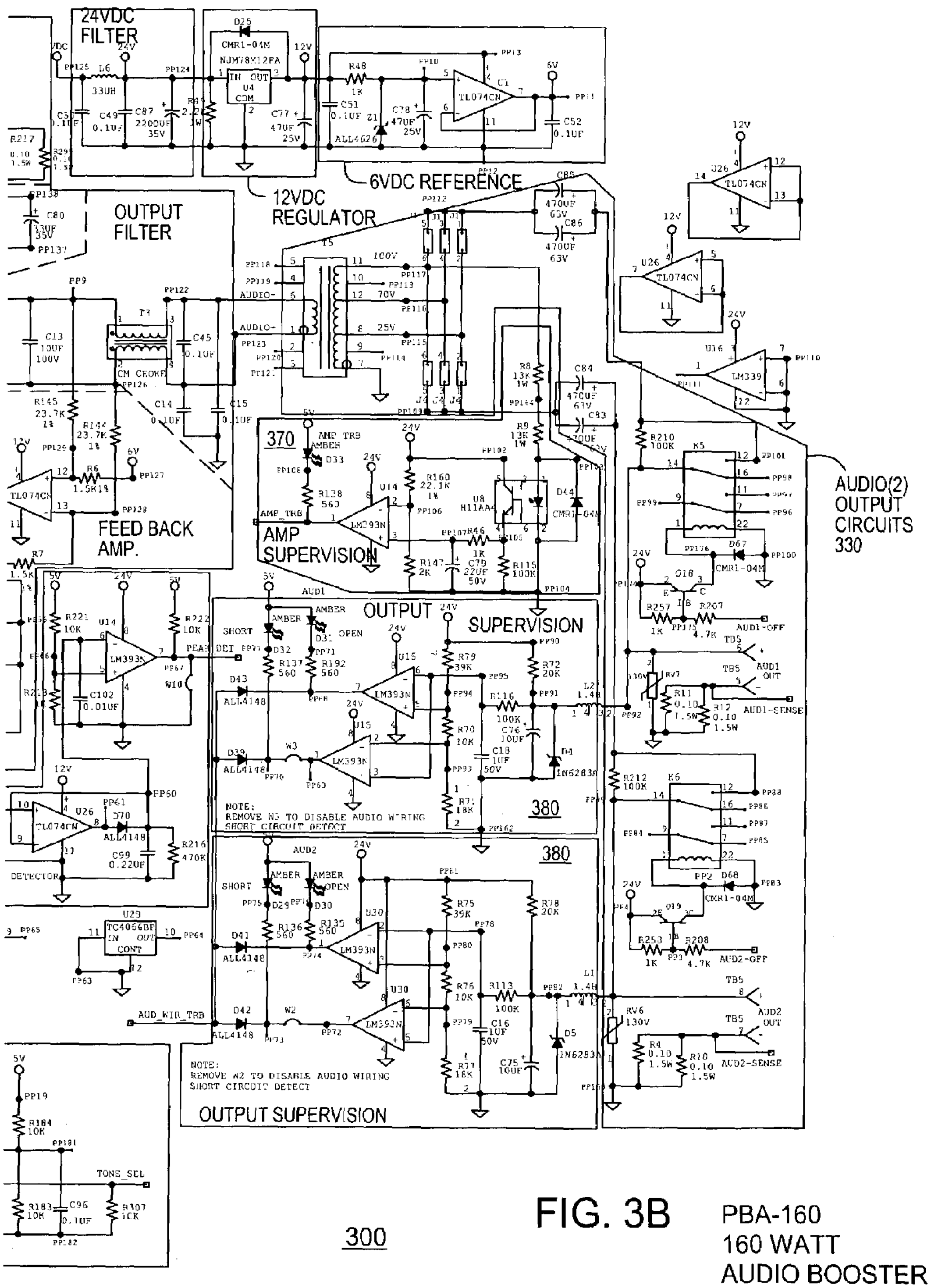

FIG. 3 illustrates a schematic diagram of a 160 watt audio booster 300 of the present invention. In one embodiment, the audio booster 300 comprises an audio amplifier 310, an audio input circuit 320, audio output circuits 330, a peak detector 340, an aux-input circuit 350, an amplifier supervision tone generator 360, an amp supervision circuit 370 and audio output supervision circuit 380.

In one embodiment, the audio booster 300 of the present invention employs a class D audio amplifier 310. At the heart of the amplifier is the PWM Controller U6 (HIP4080A) that takes the audio from the Pre-amplifier and converts it to PWM (Pulse With Modulation). (The PWM frequency is determined by the CLOCK Circuit.) The PWM Controller drives the PWM signal into the four MOS-FET's in the Power Stage. The signal from the Power Stage is channeled through the Filter Stage to remove most of the switching frequencies allowing the audio power to be extracted. A current Limiter is employed at the Power Stage to ensure the current through the MOS-FET's does not exceed design specs. If an over-current does occur, the Shut-Down Circuit is activated shutting down U6. A connection to microcontroller U17 is provided through the Microcontroller Control Input Circuit to allow the amplifier to be put to "SLEEP" under certain condition such as AC Fail. The Under Voltage Lockout Circuit ensures that there is at least 18 Vdc available before the amplifier is enabled.

The audio input circuit 320 connects the MAIN LOOP as shown in FIG. 1 to the amplifier. The audio level is attenuated from 25V or 70.7V to pre-amp level and conditioned. A microcontroller input is provided to allow the audio to be switched ON or OFF through software if the need arises.

The audio output circuits 330 operate such that the output from the PWM OUTPUT FILTER is fed through an audio power transformer to provide a selectable output level of 25V, 70.7V or 100 Vrms. For an 80 W booster, this would feed power to the AUXILIARY LOOP #1. For a 160 W booster, the output would be split to feed two loop, AUXILIARY LOOP #1 and AUXILIARY LOOP #2.

The peak detector 340 is used to determine if an audio input signal is present on the MAIN LOOP when AC Fails and running on Battery. If it is, this is interpreted to be an ALARM and the amplifier is turned back ON from SLEEP. It is only used in Two-Wire Mode and disabled in Four-Wire Mode as discussed below.

The AUX-INPUT circuit 350 provides a means for an ALARM input signal to the booster in FOUR-WIRE MODE. This will activate the amplifier in the event it may be in SLEEP mode due to loss of AC power. The input is switchable between C.C. (Contact-Closure) or NAC (Notification Appliance Circuit). In C.C. mode, the input is supervised for an OPEN circuit by the AUX-IN SUPERVISION CIRCUIT.

Jumper W1 must be removed and a 10,000 ohm End Of Line Resistor is required. If AUX-INPUT is activated, the EXP-OUTPUT will also activate.

The AUX-INPUT circuit 350 also employs an AUX/AUDIO trouble relay. In the event that a TROUBLE condition occurs in the booster, this relay K8 will release and place the AUDIO TROUBLE RESISTORS (5,000 ohms) on the MAIN LOOP as an indication of TROUBLE.

The amplifier supervision tone generator 360 operates such that in the absence of an audio input from the MAIN LOOP, the tone generator provides an audio tone burst used to verify the amplifier is working. In this design, it consists of a microcontroller U27 that generates a tone and some signal conditioning circuitry to provide waveshaping and a level adjustment. A microcontroller (TONE GEN. CONTROL) input is provided to allow the tone to be switched ON and OFF through software.

The amp supervision circuit 370 is a detector circuit that responds to audio on the output of the amplifier. The microcontroller checks this circuit periodically to determine if the amplifier is working NORMALLY. If the circuit does not detect audio when interrogated, an AMP TROUBLE is indicated by the microcontroller U17.

The AUD1/AUD2 output supervision circuits 380 operate such that audio output wiring of AUXILIARY LOOP #1 and #2 are supervised by these circuits. If an OPEN or SHORT is detected, a TROUBLE is reported and the appropriate LED's will light. A 10,000 ohm End Of Line (EOL) Resistor is required on the last device (speaker) as shown in FIG. 1.

Figure 4:
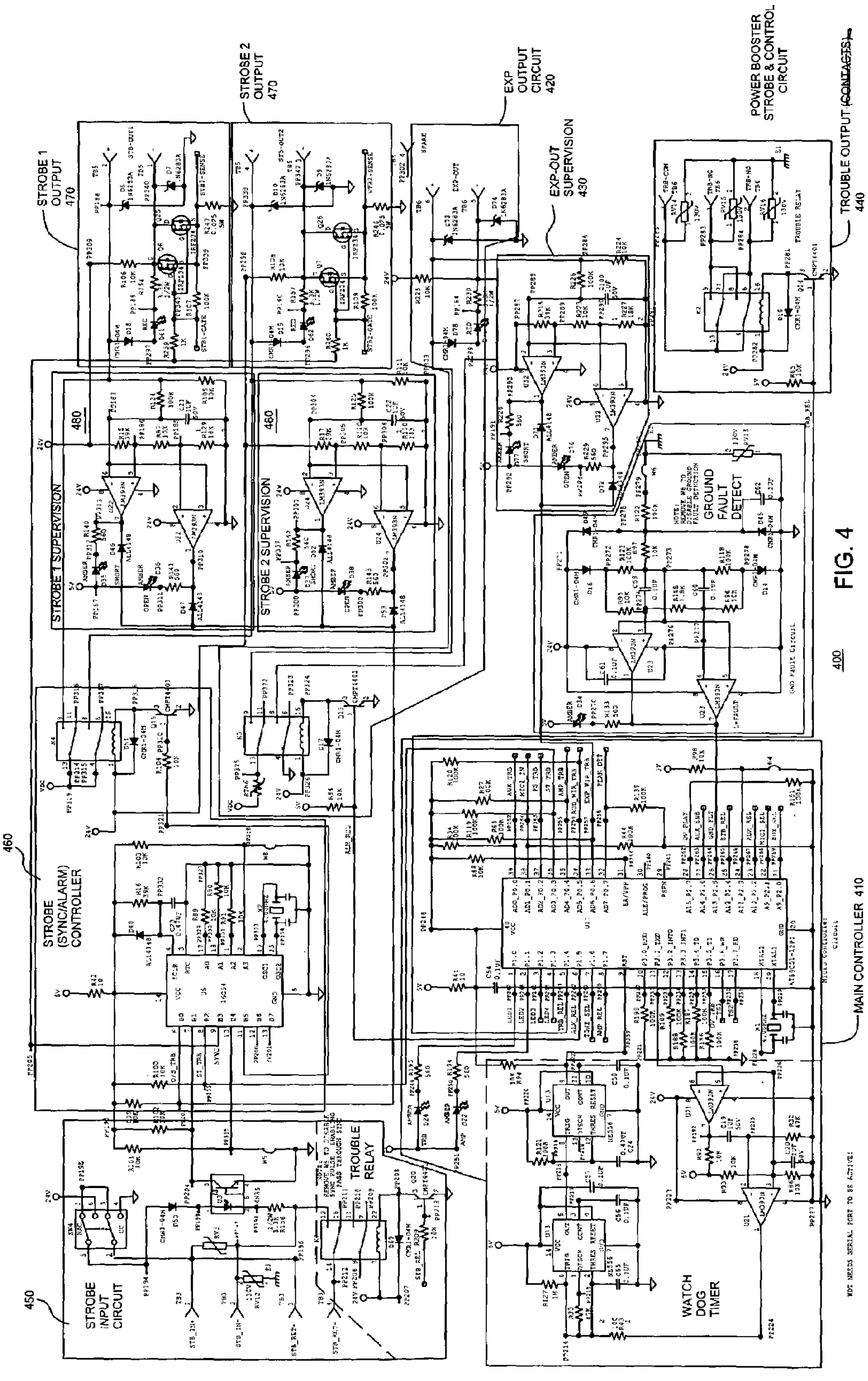
FIG. 4 illustrates a schematic diagram of a power booster strobe and control circuit of the present invention.
Figure 4A:
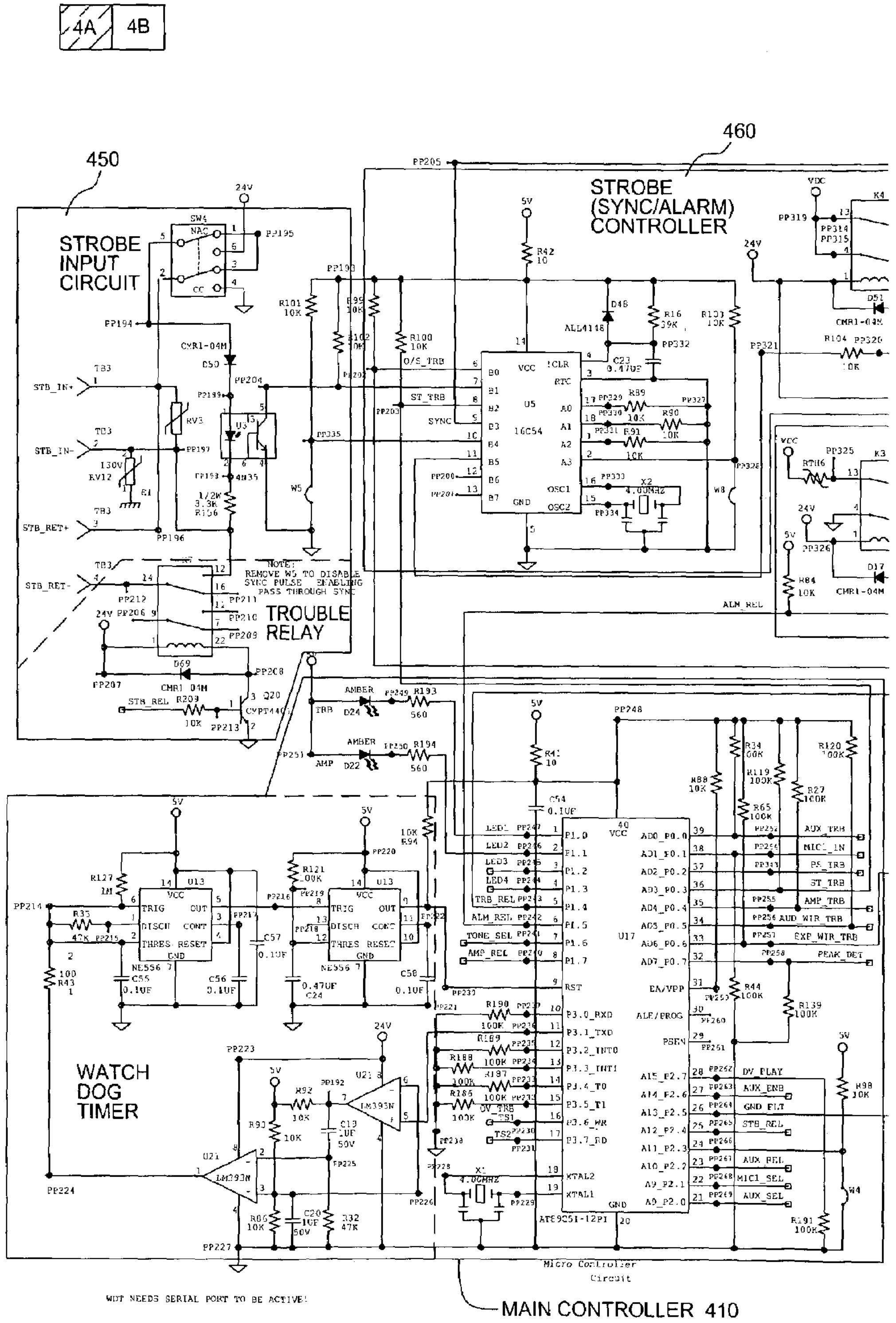
FIGS. 4A and 4B are magnified views of FIG. 4.
Figure 4B:
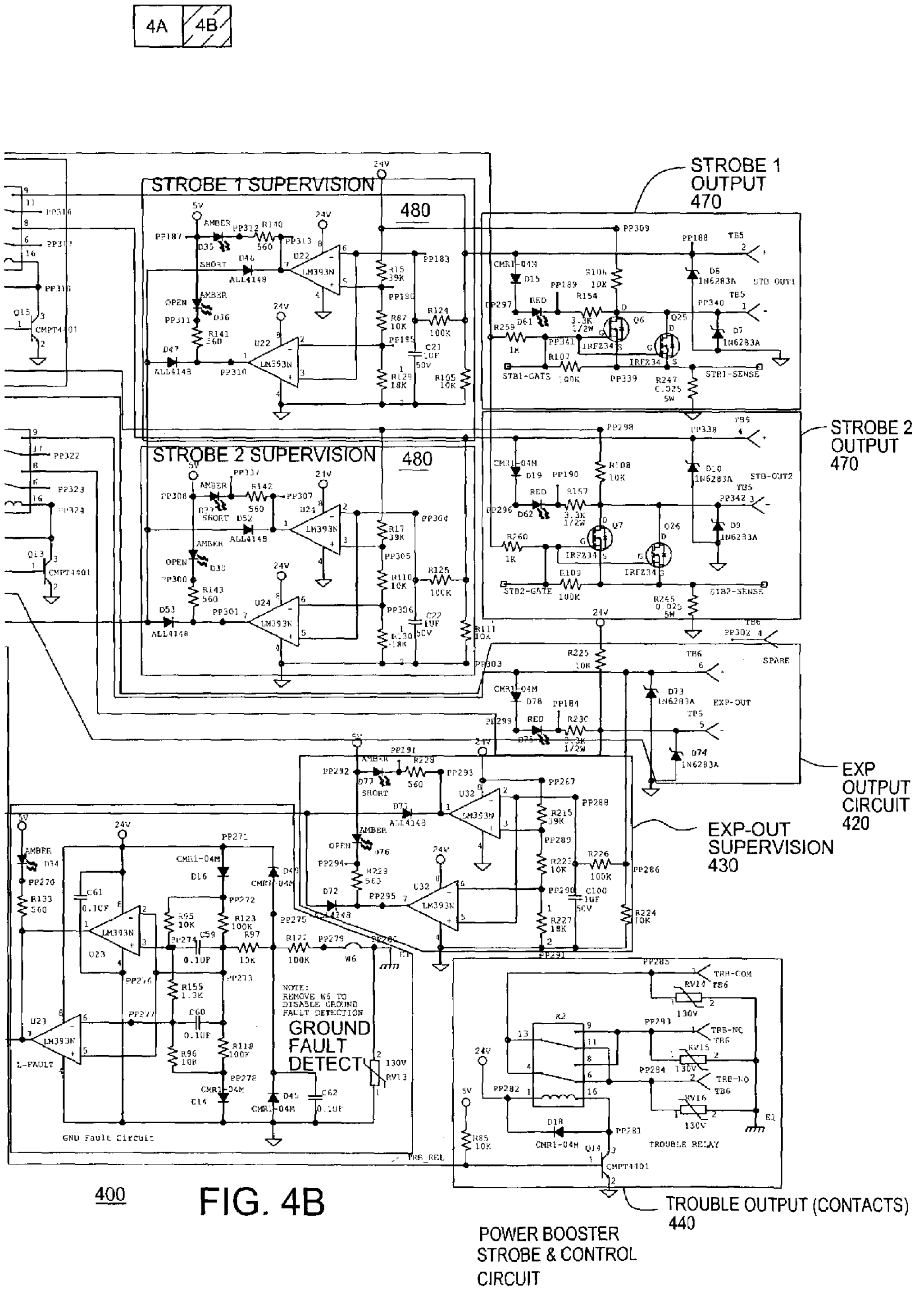

FIG. 4 illustrates a schematic diagram of a power booster strobe and control circuit 400 of the present invention. Specifically, in one embodiment of the present invention, the audio booster is deployed with a power booster for providing power to a notification appliance having visual notification capability, e.g., a strobe. In one embodiment, the power booster strobe and control circuit 400 comprises a main controller 410, an EXP-OUT Circuit 420, an EXP-OUT supervision circuit 430, trouble output contacts 440, a strobe input circuit 450, a strobe controller 460, strobe output circuits 470, and strobe output supervision circuits 480.

Specifically, the main controller 410 (with a watchdog timer) monitors the various supervision circuits and reports TROUBLE when problems are found. If AC fails, this microcontroller will put the amplifier in SLEEP mode unless an ALARM is present. The watchdog timer ensures that the main controller itself is working properly. If not, it initiates a reset to the main controller.

The EXP-OUT circuit 420 is a NAC type DC output that basically will follow the AUX-INPUT signal when an ALARM is present in FOUR-WIRE MODE. It can be used to relay the ALARM signal to addition boosters' AUX-INPUTS (NAC only mode). Up to 0.5 amps is provided when an ALARM is present.

The EXP-OUT supervision circuit 430 operates such that it is used with a 10,000 ohm End Of Line Resistor, where this circuit supervises the output wiring from EXP-OUT to any devices connected, e.g., other boosters AUX-INPUTS. If an OPEN or SHORT is detected, TROUBLE is reported.

The trouble output contacts 440 are general purpose contacts for reporting TROUBLE condition and the strobe input circuit 450 operates such that the input (a strobe alarm signal) can be selected as Contact Closure (C.C.) or NAC and is used to trigger the strobe outputs.

The strobe controller 460 provides a link between STROBE INPUT and OUTPUT as well as the capability to generate sync pulses in SYNC MODE to synchronize strobes or capability to follow sync pulses from the input side in PASS THRU MODE.

The strobe 1 and 2 outputs 470 follows STROBE INPUT and provides up to 2 amps to each output to power addition strobes. The strobe 1 and 2 supervision circuits 480 operate such that output wiring is supervised with a 10,000 ohm End Of Line Resistor installed on each circuit. Any OPEN or SHORT condition will be reported as TROUBLE.

Figure 5:
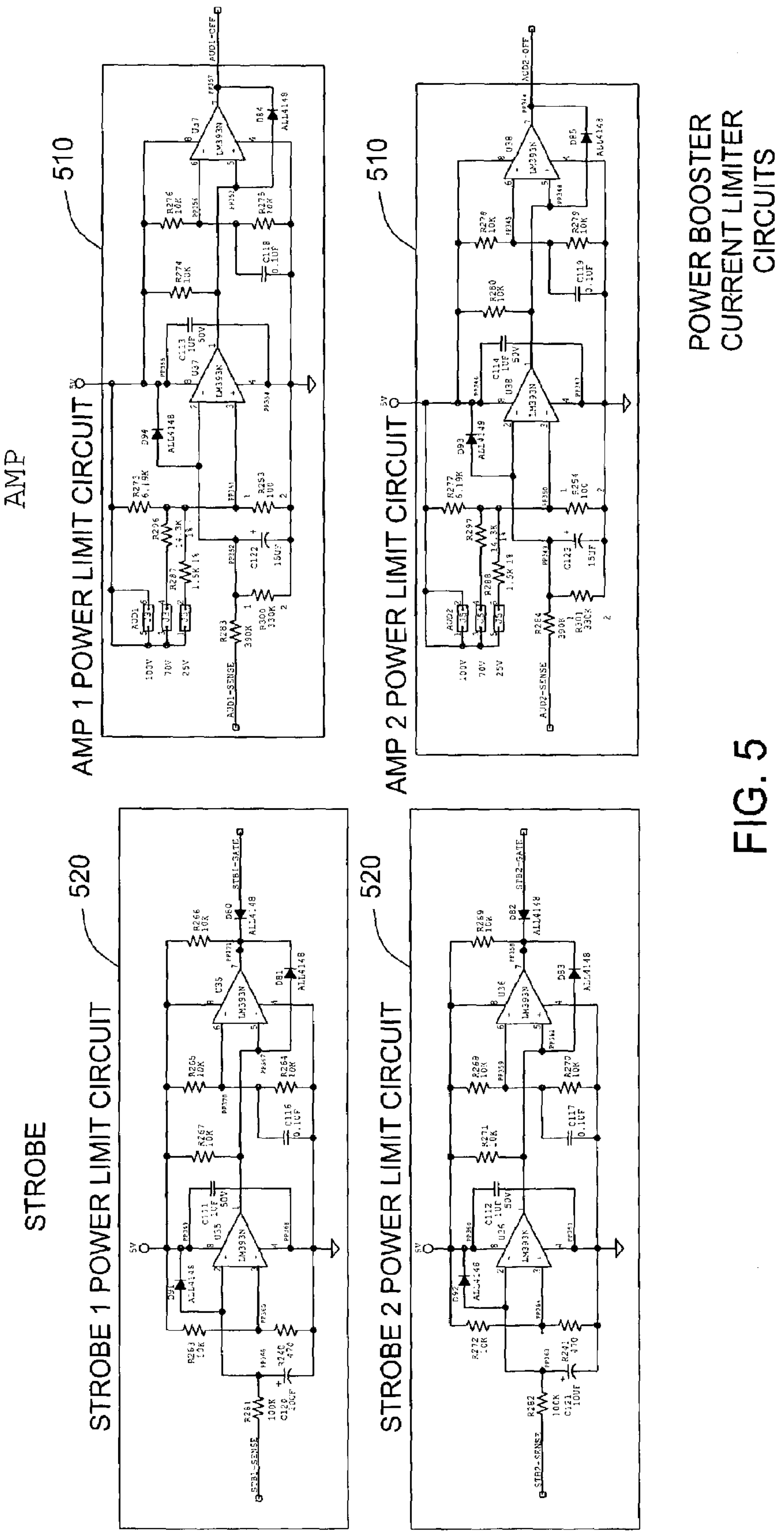
FIG. 5 illustrates a schematic diagram of power booster current limiter circuits of the present invention.

FIG. 5 illustrates a schematic diagram of power booster current limiter circuits of the present invention. Specifically, the AMP 1 and 2 power limiter circuits 510 are operated such that audio outputs are constantly monitors by these circuits using a current sensing resistor method. If the output power exceeds 150 to 200 watts, the output is disconnected by the corresponding relay K5 or K6. The output will remain OFF until power is cycled OFF and back ON. This approach protects the remaining unaffected output and to provide the user with a "POWER LIMITED" capability.

The strobe 1 and 2 power limiter circuits 520 are operated such that the strobe outputs are monitored during ALARM mode using the current sensing resistor method, as well. If the output current reaches the 4 to 7 amp range, the output will be disabled by switching OFF the corresponding MOS-FET. The output can be restored by resetting the ALARM condition. By remaining below 200 watts, the output complies with "POWER LIMITED" requirements.

In alternative embodiments, the present audio booster is adapted to address the situation where the audio booster loses AC power. In such a scenario, it is desirable to conserve the battery backup power of the audio booster for broadcasting emergency messages only. Namely, if the voice evacuation panel 130 is broadcasting non-emergency messages, e.g., background music or general paging, and the audio booster 110 has lost AC power, then without a mechanism to inform the voice evacuation panel of the failure or a mechanism for the audio booster to selectively ignore non-emergency messages, the audio booster will continue to broadcast the non-emergency messages, thereby draining the back-up battery. If a subsequent emergency message is broadcasted at a later time, the audio booster may not have enough power to perform its functions.

To address this situation, the present invention provides two alternate embodiments. The first embodiment is a "two-wire" approach and the second embodiment is a "four-wire" approach.

Figure 6:
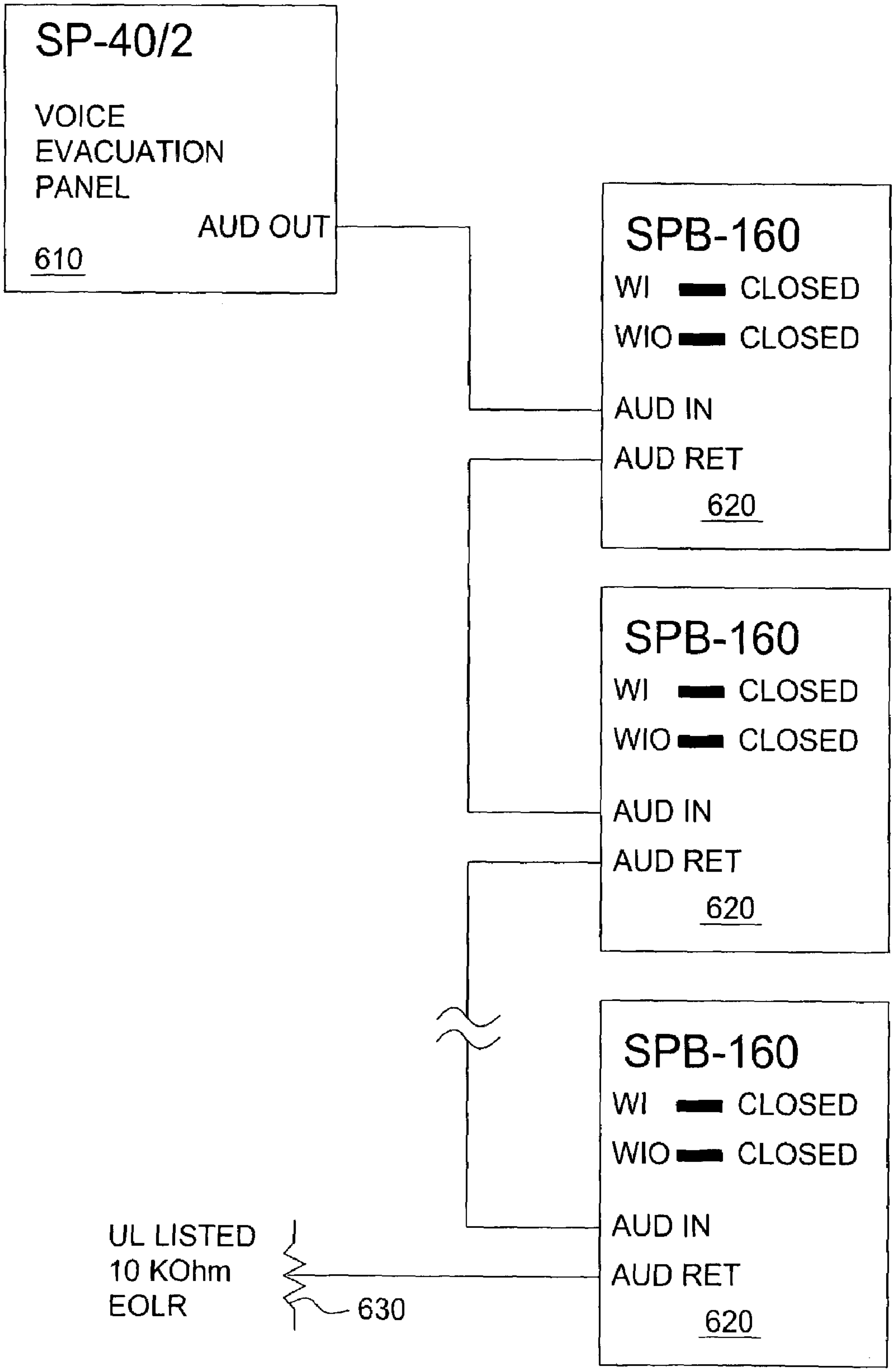
FIG. 6 illustrates a two-wire configuration.

FIG. 6 illustrates the two-wire configuration. In this embodiment, the voice evacuation panel 610 or 130 of FIG. 1 is capable of detecting when an audio booster 620 is operating under battery back-up power, by monitoring the end of line resistance, e.g., a 10K Ohm resistor 630.

In operation, if a predefined resistance, e.g., 10K Ohm, is detected as the end of line resistance, then the voice evacuation panel 610 will determine that the audio boosters are operating normally. If a very high resistance, e.g., infinite, is detected as the end of line resistance, then the voice evacuation panel 610 will determine that there is a break in the line. If a very low resistance, e.g., zero resistance, is detected as the end of line resistance, then the voice evacuation panel 610 will determine that there is a short in the line. Finally, if a predefined intermediate resistance, e.g., 5K Ohm, is detected as the end of line resistance, then the voice evacuation panel 610 will determine that at least one of the audio boosters is operating in battery backup mode. Namely, when the AC power fails in the audio booster 620, an additional 10K ohm resistance is made parallel with the EOLR. This effectively lowers the detected resistance below 10K Ohm.

Specifically, supervision of the audio booster is performed over the same two wires used by the audio input signal. If any one audio booster 620 connected in the system goes into trouble, all secondary operations (background music (BGM), telephone paging, and night ring) will disengage from all audio boosters connected in the system, i.e., the voice evacuation panel will only forward emergency messages. This method conserves battery backup power, if AC power is lost. When an alarm message or a live voice message from the microphone is broadcast by the SP40/2 voice evacuation panel 610, the audio booster amplifier section is energized and the message is broadcast.

Connecting 2 to 20 SPB-160 boosters to an SP-40/2 in the two wire mode is accomplished by connecting the audio returns (AUD RET) to the next audio input (AUD IN), and placing the UL Listed 10K Ohm EOLR on the last AUD RET. Jumper W10 shall be installed.

In one embodiment, the SP-40/2 (610) is a Voice Evacuation Panel with a 40 watt audio output. Using only the TWO-WIRE MAIN LOOP, up to 20 Audio Boosters (620), SPB-160 or SPB-80/4, can be connected. It should be noted that the limit of 20 audio boosters comes from the 40 watt source divided by 2 watts per booster input. If a larger source were used, more boosters could be added. In addition, if the 2 watt per booster limit is changed, more boosters may be used.

A 10,000 ohm End Of Line Resistor (630) is added to the last device so the line can be supervised. The PEAK DETECTOR should be activated by installing Jumper W10 on the booster and the SP-40/2 should be set to disable any NON-ALARM audio during TROUBLE conditions. This allows the amplifier to stay in SLEEP mode if AC power fails, thus conserving Battery power. If an ALARM does occur, the PEAK DETECTOR will wake-up the amplifier in the booster.

Figure 7:
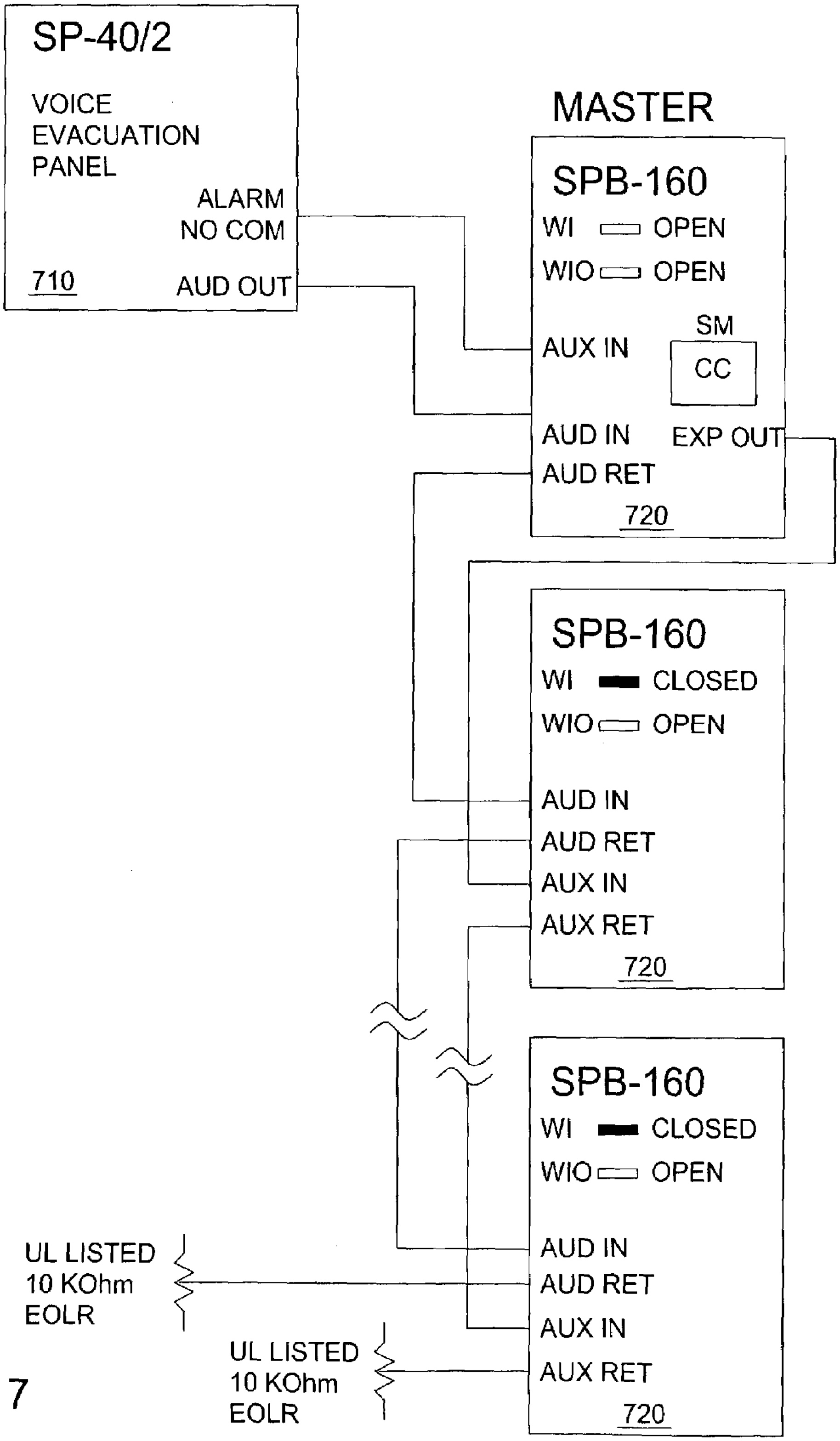
FIG. 7 illustrates a four-wire configuration.

FIG. 7 illustrates the four-wire configuration or mode. In this configuration, four wires are deployed. The added wires allow individual boosters to determine whether to broadcast the non-emergency messages or to only broadcast emergency messages. Namely, the additional wires provide a signal from the voice evacuation panel to each audio booster as to whether the current message is an emergency or non-emergency message.

In operation, the audio booster has a jumper to define whether it is operating in a two-wire or a four wire configuration. If the jumper is set to the four-wire configuration and the AC power for a particular audio booster has failed, then only that audio booster will operate in a manner that only emergency messages are broadcasted. In other words, once AC power has failed, the audio booster will monitor on the additional wire as to whether a current message is an emergency message. If the message is a non-emergency message, the audio booster operating with battery-backup power will not broadcast the non-emergency message, thereby conserving power. In this configuration, audio boosters that have AC power will continue to operate normally, whereas audio boosters with failed AC power will operate in a power conservation mode.

Specifically, the Four Wire Audio Mode is used when multiple Audio Boosters are used on the output of the SP40/2 and it is not desirable to loose secondary operations when a single audio booster goes into trouble. Only that Audio Booster 720 with failed AC power will loose secondary operations. An 8-33 VDC NAC or a contact closure applied to the AUX IN terminals will energize the Audio Booster on battery backup and have it broadcast the message.

Connecting 2 to 20 SPB-160 panels to an SP-40/2 in the four wire mode is accomplished by connecting the audio output (AUD OUT) from the SP-40/2 to the master SPB-160 audio input (AUD IN). The UL Listed 10K Ohm EOLR shall be placed on the last SPB-160 AUD RET.

On the master SPB-160 panel, connect the SP40/2 "normally open" and "common" alarm relay connections to the AUX IN connections. Connect a UL Listed 10K Ohm EOLR across the AUX RET connections. Place the switch SW1 in the "CC" position. Remove jumper on W1 and W10.

Connect the EXP OUT on the master SPB-160 to the AUX IN of the second SPB-160. Connect the AUX RET to the next SPB-160 AUX IN and continue to the last SPB-160. The UL Listed 10K OHM EOLR on the last AUX RET on the last SPB-160.

On SPB-160 panels 2 through 20, set SW1 to NAC. Insure jumper W1, is in place. Remove jumper W10.

When the contact closure is used in the 4-wire mode, jumper W1 shall be removed on the master SPB-160 and installed on subsequent SPB-160 panels. If jumper W1 is removed and an EOLR is not installed, the TROUBLE LED D24 and the AUX TRB LED will be lighted.

In the four-wire embodiment, the same connection is made from the MAIN LOOP to each of up to 20 audio boosters (720). Either SPB-160 or SPB-80/4 can be employed. An additional pair of wires connects from the SP-40/2 ALARM contacts to the AUX-INPUT (C.C. mode) of the first booster which becomes the MASTER. The AUX-OUT NAC type circuit is used to provide the ALARM signal to the remaining 19 REMOTE audio boosters' AUX-INPUT (NAC mode), where the last device should have a 10,000 ohm End Of Line Resistor installed. The peak detector (W10) should be disabled in this configuration since a hardwired ALARM signal is now available.

It should be noted that the terms PBA and SPB are used interchangeably in the present disclosure. FIGS. 8-21 are illustrative schematic diagrams for the voice evacuation panel.

Figure 8:
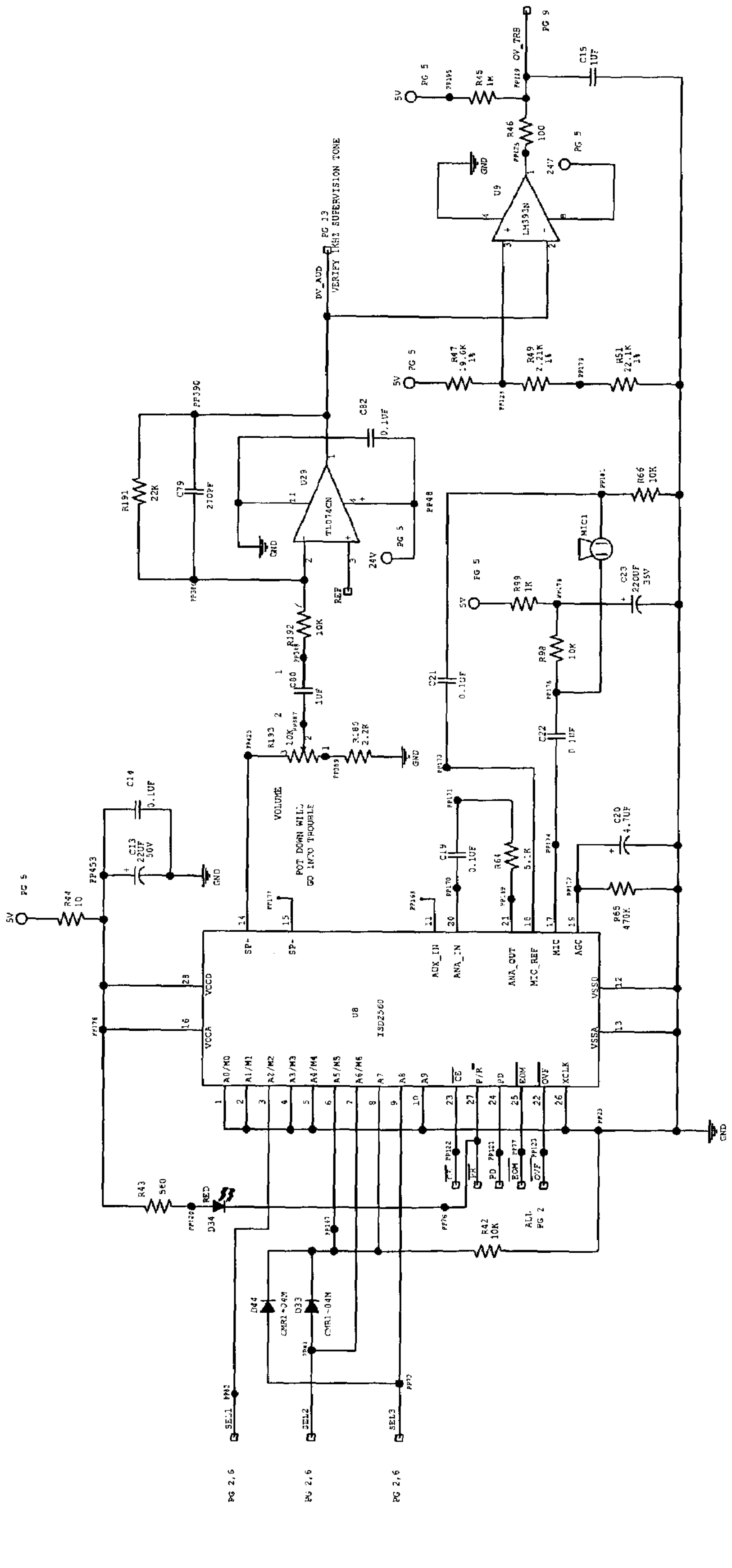
FIG. 8 illustrates a schematic diagram of a voice evacuation panel (SP 40/2) digital voice output circuit of the present invention.
Figure 9:
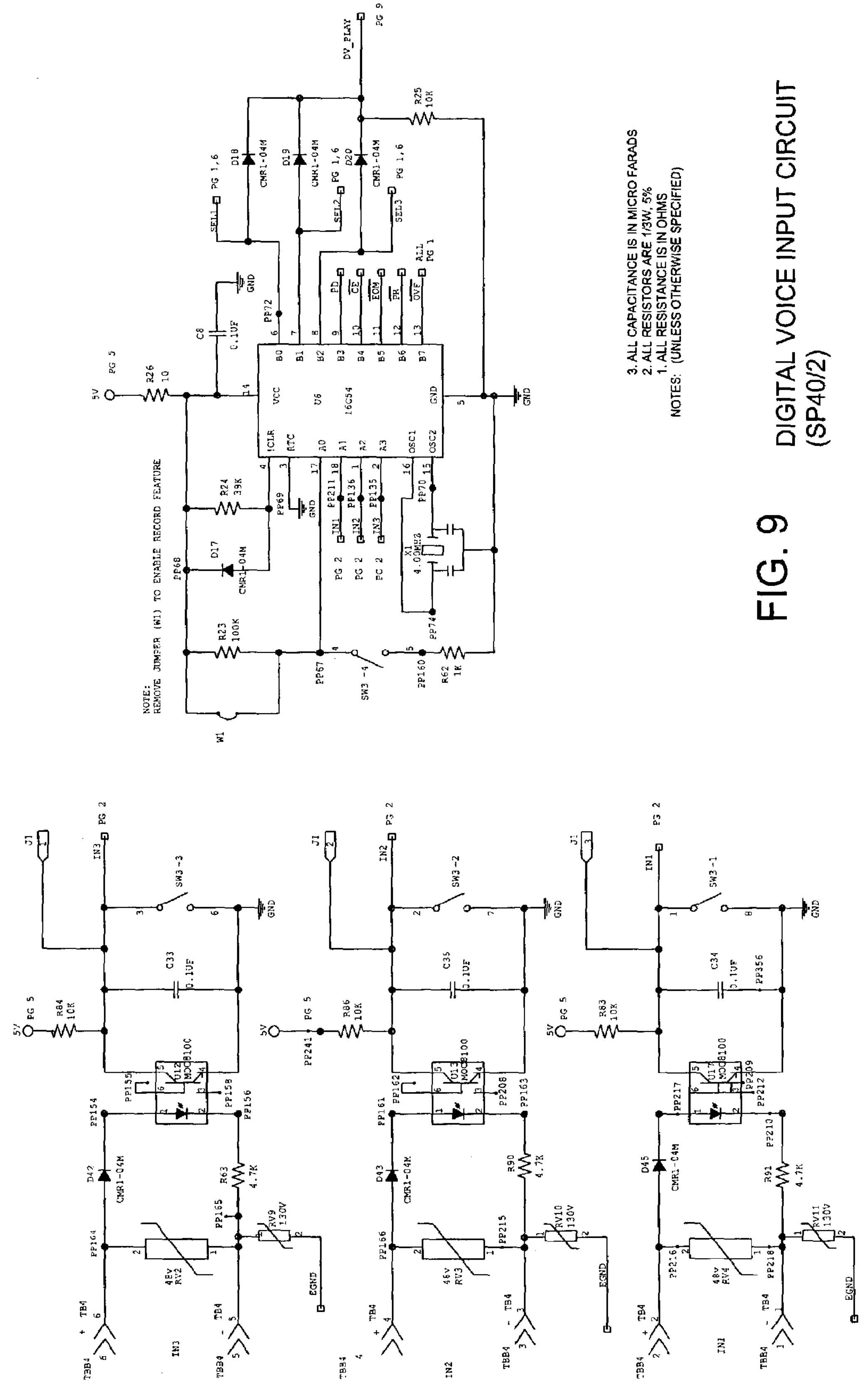
FIG. 9 illustrates a schematic diagram of a voice evacuation panel (SP 40/2) digital voice input circuit of the present invention.

FIG. 8 and FIG. 9 illustrate the digital voice (DV) input/output circuit. In one embodiment, this circuit is used to record or playback up to 3 DV messages. Message playback is initiated by one of the three NAC inputs. Recording the DV messages is initiated by removing jumper W1 and closing position 4 on SW3. The record LED (D34) will illuminate and the microphone MIC1 will become active for recording. Voice messages are stored on U8 and the microcontroller (U6) monitors the inputs and controls the playback and recording of the messages. This circuit is constantly supervised.

Figure 10:
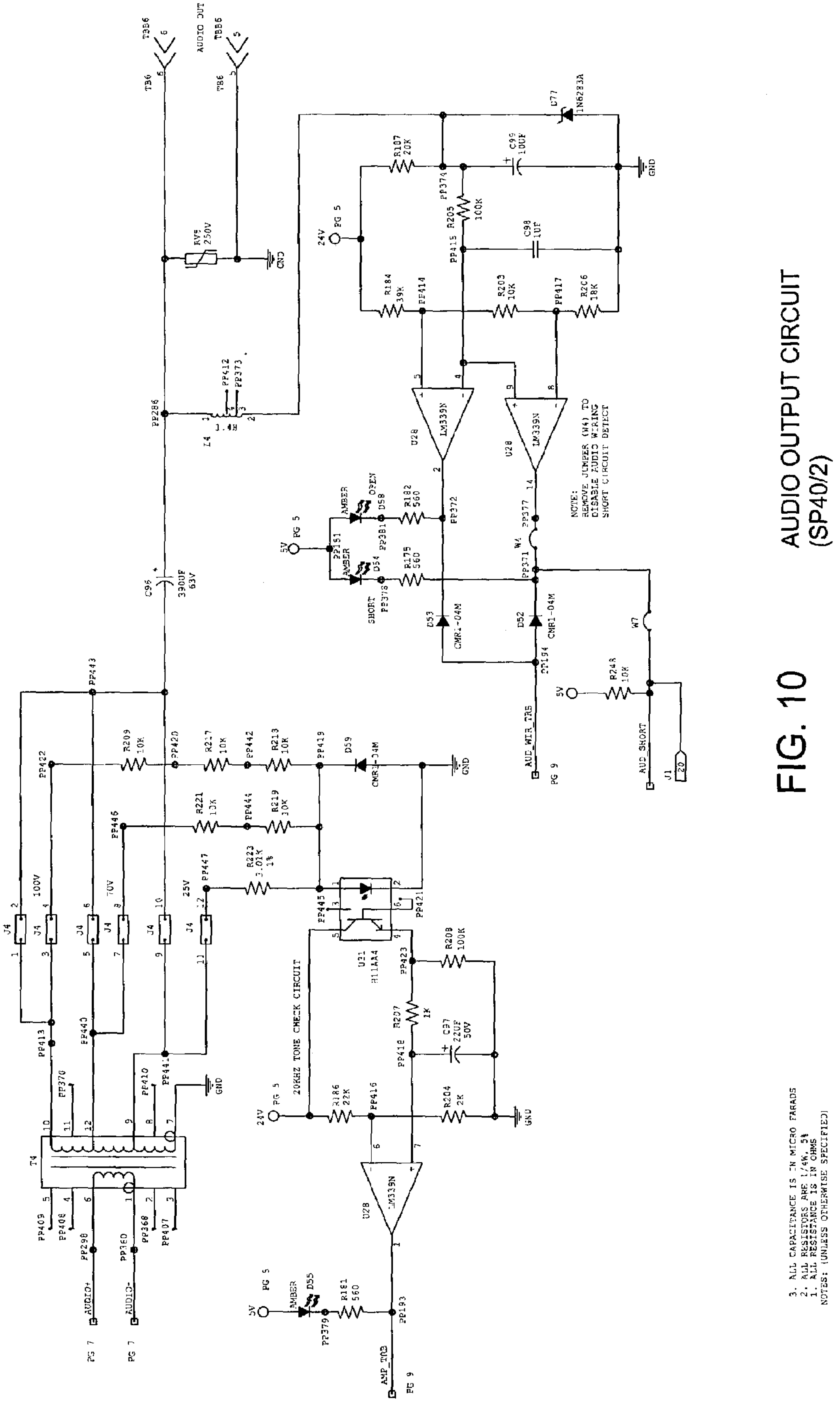
FIG. 10 illustrates a schematic diagram of a voice evacuation panel (SP 40/2) audio output circuit of the present invention.

FIG. 10 illustrates an audio output circuit. In one embodiment, the output from the Amplifier passes through the audio power transformer to provide a selectable output level of 25V or 70.7 Vrms. The output can reach a maximum of 40 Watts. This circuit also provides supervision for the audio amplifier and the Audio Output. If an audio OPEN or SHORT is detected, a TROUBLE is reported and the appropriate LED's will illuminate. A 10,000 ohm End Of Line Resistor is required on the last device (speaker). This circuit (along with the main microcontroller, U14) determines when audio should be shut off when audio boosters are connected in 2-wire system.

Figure 11:
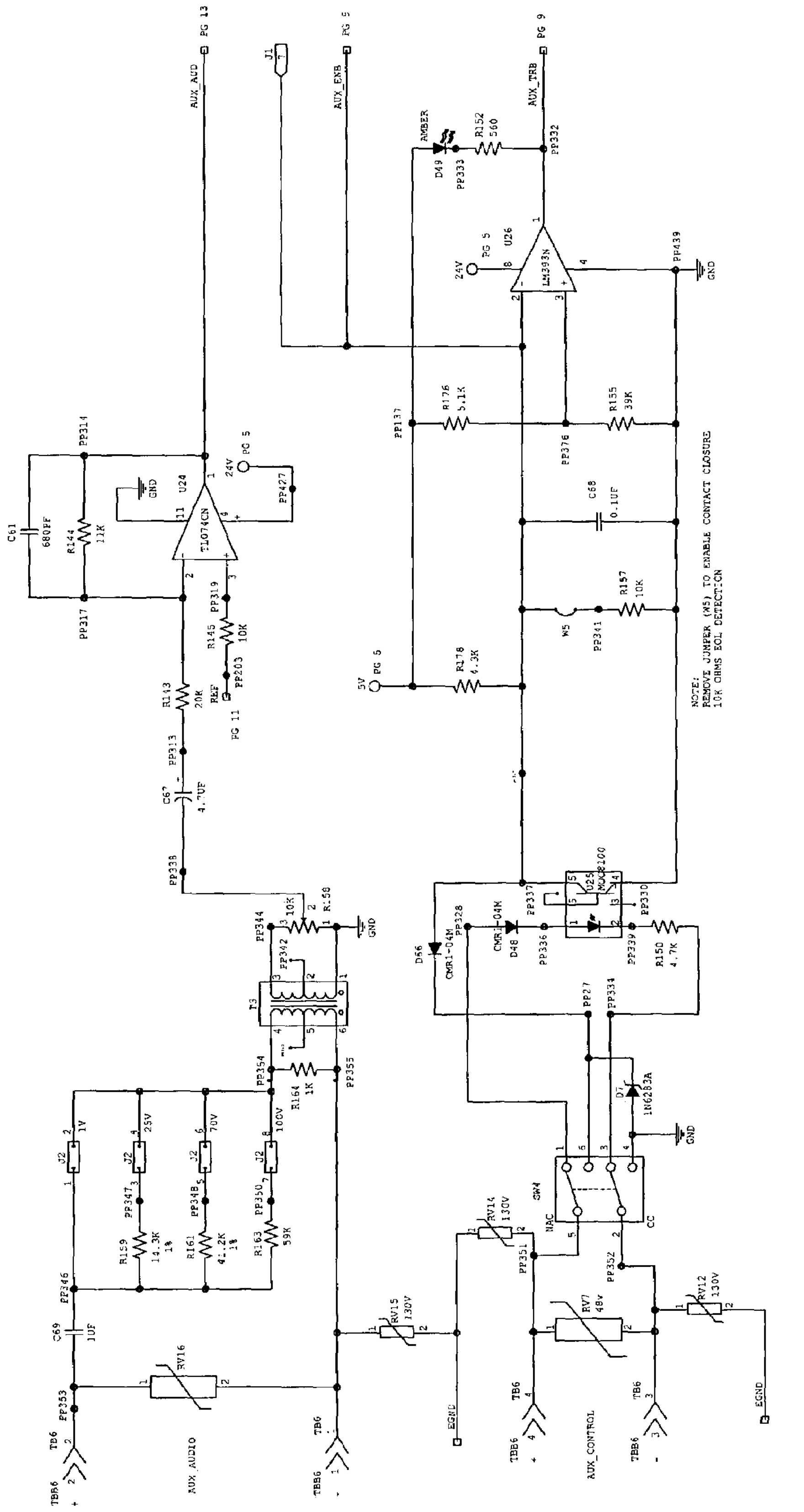
FIG. 11 illustrates a schematic diagram of a voice evacuation panel (SP 40/2) auxiliary input circuit of the present invention.

FIG. 11 illustrates an auxiliary input circuit. In one embodiment, this circuit consists of 2 parts, the audio and the controls. The audio section can accept a 1V, 25V, 70.7V, or a 100 Vrms audio input, provide filtering, and pass the signal through to the audio mixer. The control section is initiated by a NAC or Contact Closure (CC) input depending on the setting of SW4. Initiating the control circuit will notify the main microcontroller that the Auxiliary should be passed through the audio mixer. In CC mode this circuit will also supervise for a 10,000 ohm End Of Line Resistor if jumper W5 is removed. A trouble here would be indicated by the illumination of the proper LED's.

Figure 12:
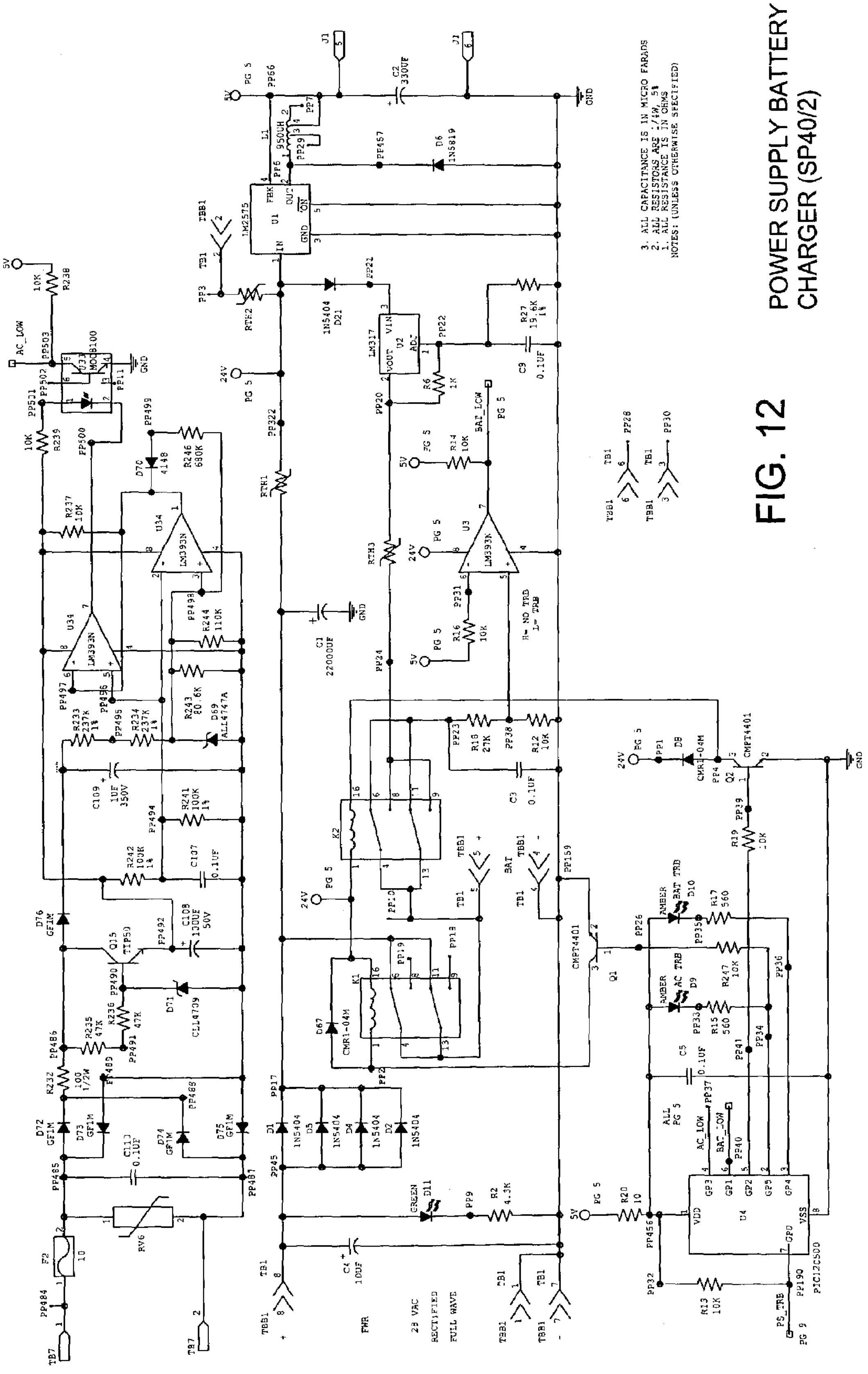
FIG. 12 illustrates a schematic diagram of a voice evacuation panel (SP 40/2) power supply battery charger of the present invention.

FIG. 12 illustrates a power supply/battery charger. In one embodiment, this circuit serves several functions.

AC Low Detect Circuit—This section of the circuit takes the AC Line voltage, rectifies it and compares the level to a reference. If the level is in the normal range above the reference, the optocoupler (U33) is switched ON to signal that AC Line is NORMAL. If the AC Line happens to be lower than the reference level or OFF, than the optocoupler will be signaling that AC is LOW.

Power Supply—If rectified full wave voltage is applied to TB1, the AC LED (D11) will illuminate and this voltage will be used to power the SP40/2. If this voltage is not present, the system will rely on DC power supplied by the batteries (2*12V).

Battery Charger Circuit—The charger uses regulated DC voltage from U2 to charge the batteries. It feeds the voltage directly to the batteries but limits the current to approximately 0.5 amps. If the batteries are drained, they will pull the full 0.5 amps. As they reach full charge, the current will fall to a much lower level (trickle-charge). If the batteries are missing or have a low voltage (less than 18.5 Volts) a trouble will be reported.

5V Regulated Circuit—This provides a precise 5 Vdc level/power to any circuit within the SP40 that requires it.

Microcontroller—The microcontroller (U4) supervises all of the functions of this circuit. If a Battery or AC trouble occur the proper LED's will be illuminated.

Figure 13:
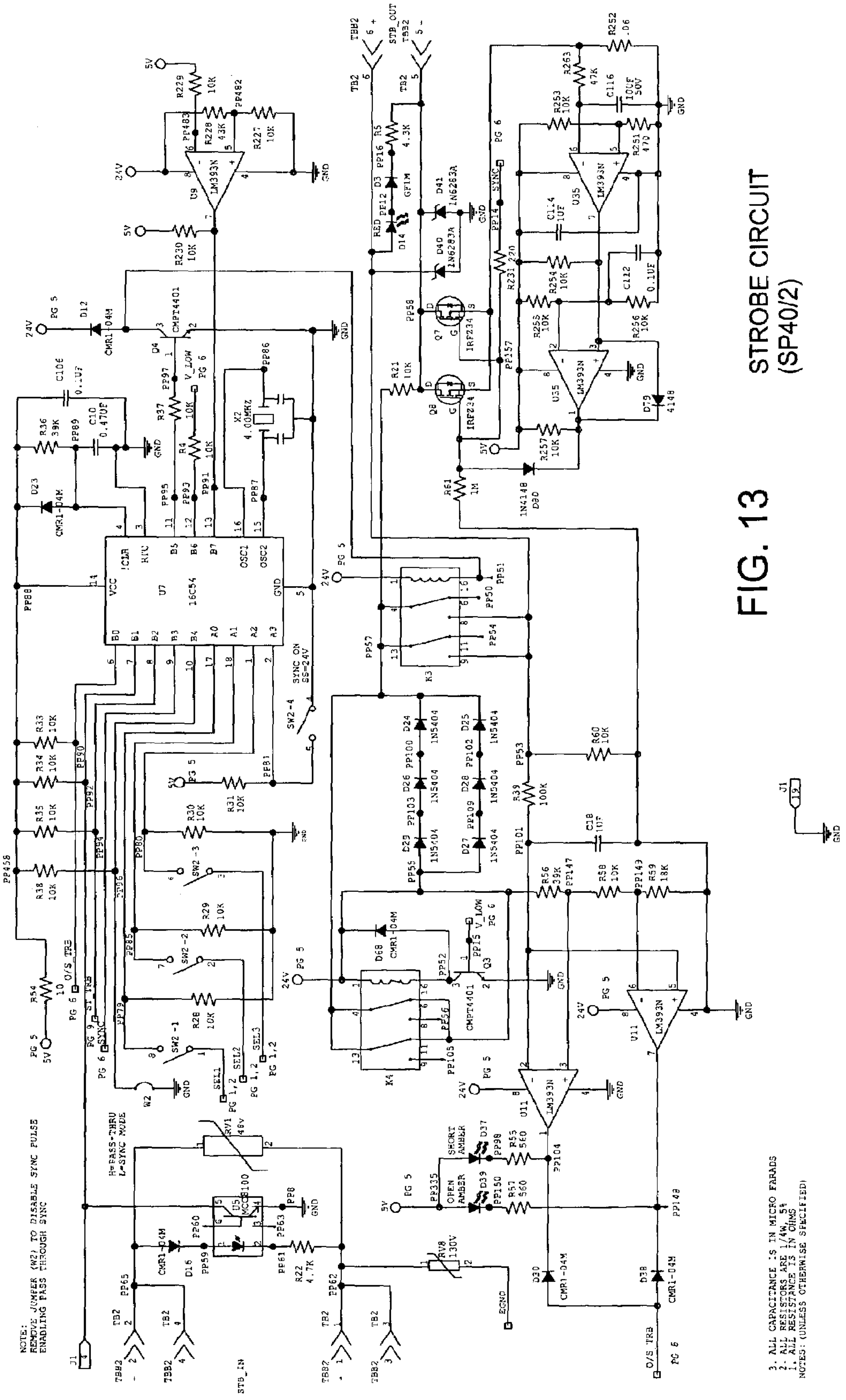
FIG. 13 illustrates a schematic diagram of a voice evacuation panel (SP 40/2) strobe circuit of the present invention.

FIG. 13 illustrates a strobe circuit. In one embodiment, this circuit serves several functions.

Strobe Input Circuit—A NAC input or the initiation of a DV message can be used to trigger the STROBE OUTPUT.

Strobe Controller—Provides a link between STROBE INPUT and OUTPUT as well as the capability to generate sync pulses in SYNC MODE to synchronize strobes, capability to follow sync pulses from the input side in PASS THRU MODE, or the capability of providing a constant 24 Volts on the STROBE OUTPUT.

Strobe Output—Follows STROBE INPUT and provides up to 2 amps to the output to power strobes. (MOS-FET's are employed to generate SYNC pulse on the outputs under control of STROBE CONTROLLER.)

Strobe Supervision—Output wiring is supervised with a 10,000 ohm End Of Line Resistor installed on the circuit. Any OPEN or SHORT condition will be reported as TROUBLE.

Strobe Power Limiting—The strobe output is monitored during ALARM mode using the Current Sensing Resistor method. If the output current reaches the 4 to 7 amp range, the output will be disabled by switching OFF the MOS-FETs. Resetting the power to the SP40 can restore the output. By remaining below 200 watts, the output complies with "POWER LIMITED" requirements.

Figure 14:
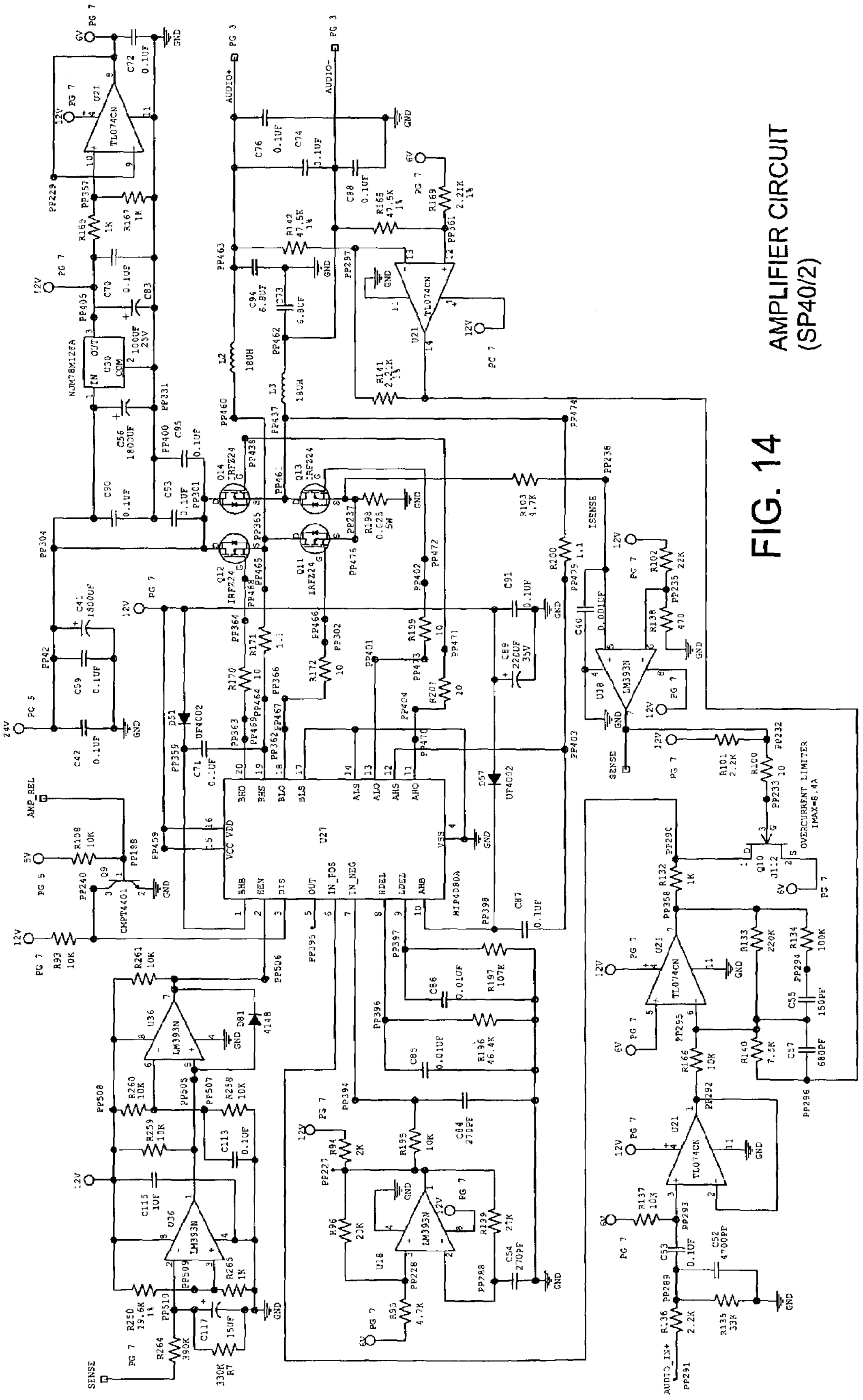
FIG. 14 illustrates a schematic diagram of a voice evacuation panel (SP 40/2) amplifier circuit of the present invention.

FIG. 14 illustrates an amplifier circuit. In one embodiment, at the heart of the amplifier is the PWM Controller U27 (HIP4080A) which takes the audio from the Pre-amplifier and converts it to PWM (Pulse With Modulation). (The PWM frequency is determined by the CLOCK Circuit.) The PWM Controller drives the PWM signal into the four MOS-FET's in the Power Stage. The signal from the Power Stage is channeled through the Filter Stage to remove most of the switching frequencies allowing the audio power to be extracted. A current Limiter is employed at the Power Stage to ensure the current through the MOS-FET's does not exceed design specs. If an over-current does occur, the Shut-Down Circuit is activated shutting down U27. A connection to microcontroller U14 is provided through the Microcontroller Control Input Circuit to allow the amplifier to be put to SLEEP under certain condition like AC Fail. The Under Voltage Lockout Circuit ensures that there is at least 18 Vdc available before the amplifier is enabled. This circuit also contains Amplifier Power Limiting. Audio output is constantly monitors by using a Current Sensing Resistor method. If the current through the Fets exceed 15 to 20 amps, the output is disconnected by disabling the FETs. The output will remain OFF until power is cycled OFF and back ON. This provides the user with a "POWER LIMITED" capability.

Figure 15:
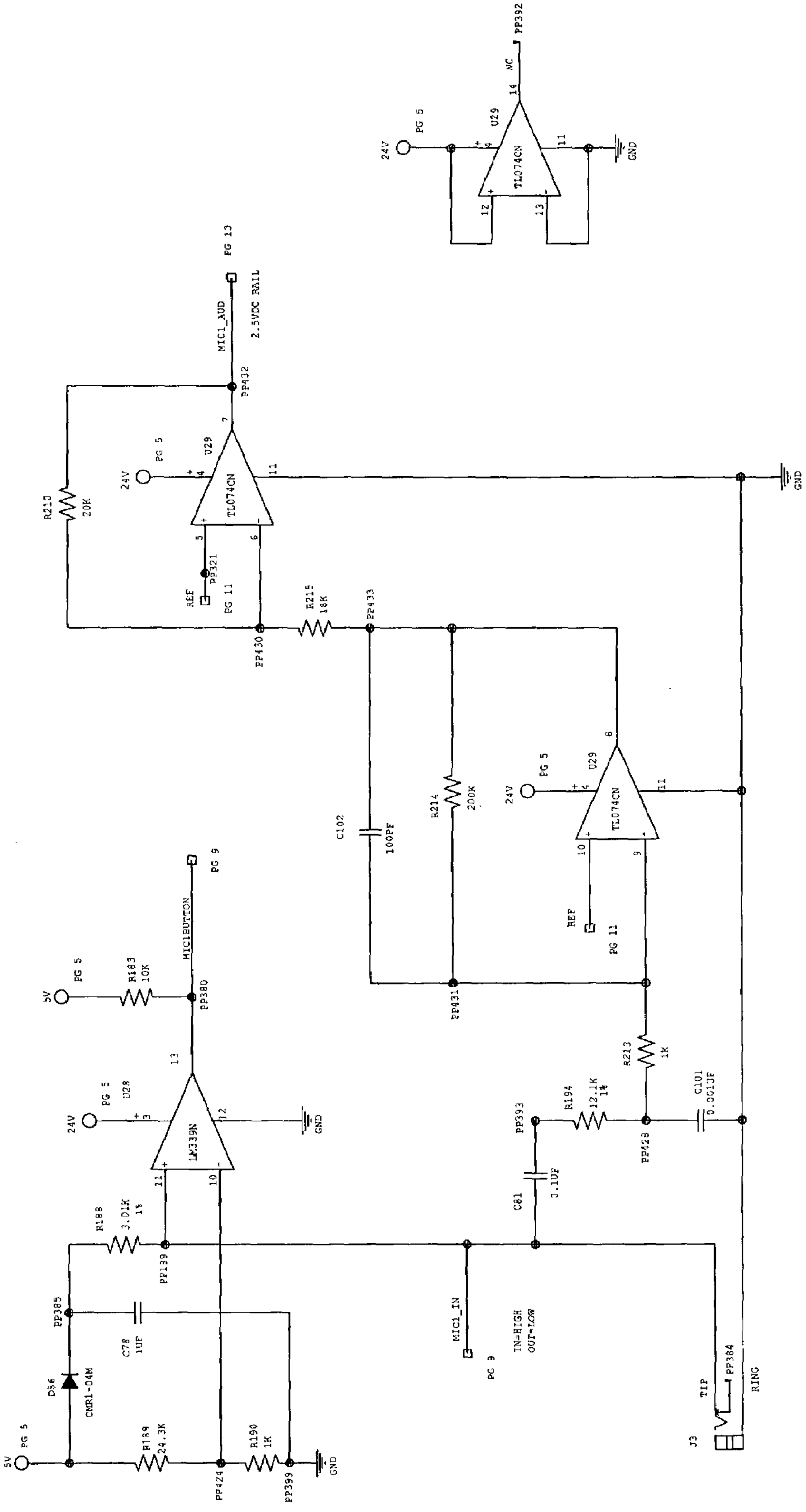
FIG. 15 illustrates a schematic diagram of a voice evacuation panel (SP 40/2) microphone pre-amp circuit of the present invention.

FIG. 15 illustrates a microphone circuit. In one embodiment, this circuit allows a hand-held microphone to be connected for live voice announcements. The circuit amplifies and filters the audio being passed through the microphone. The Microphone is constantly supervised for a missing or damaged condition. This circuit also detects if the microphone button is being pushed and reports this information to the main microcontroller (U14).

Figure 16:
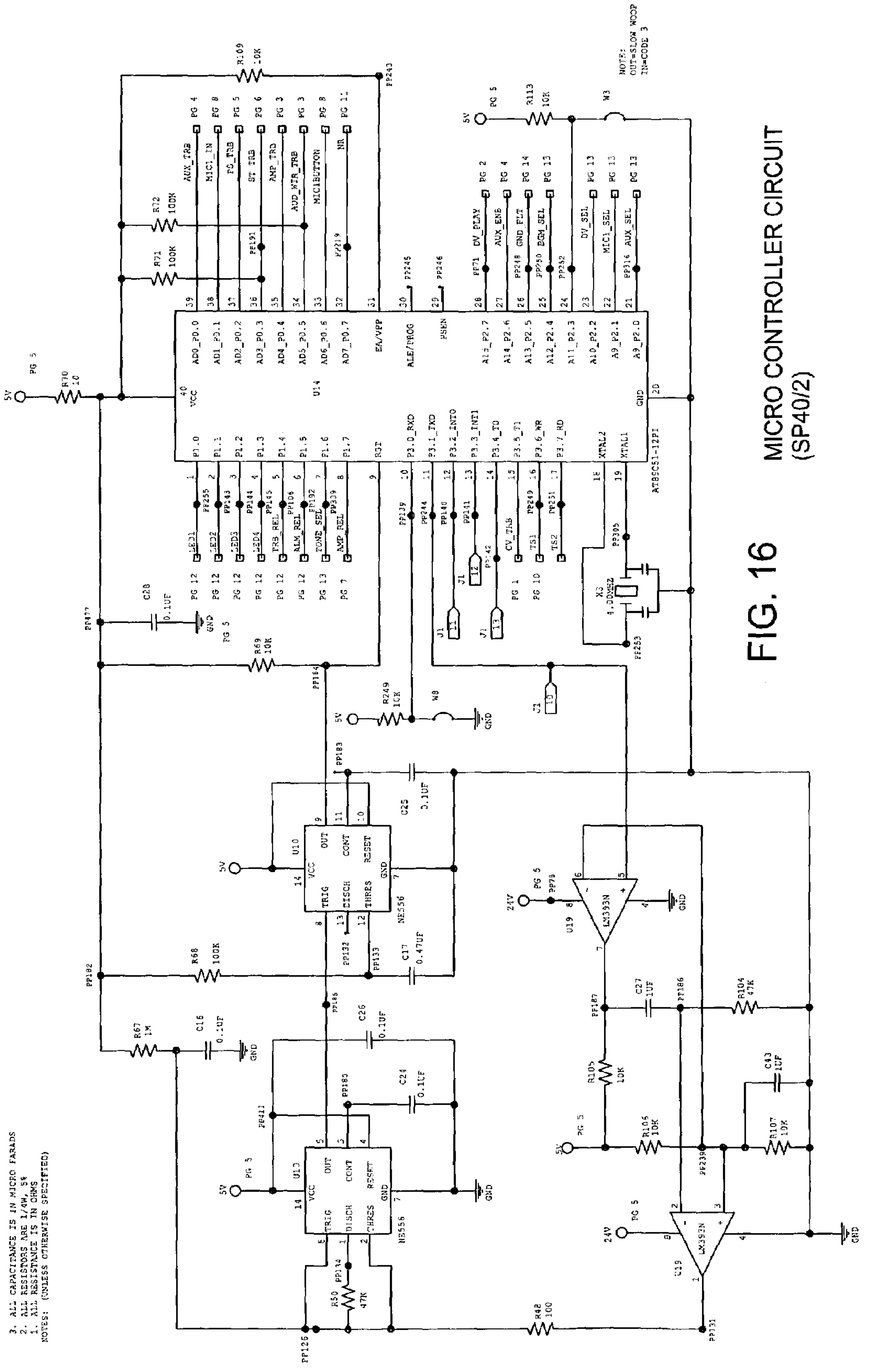
FIG. 16 illustrates a schematic diagram of a voice evacuation panel (SP 40/2) micro-controller circuit of the present invention.

FIG. 16 illustrates a main microcontroller circuit (with watchdog timer). This circuit monitors the various supervision circuits and reports TROUBLE when problems are found. If AC fails, this micro will put the amplifier in SLEEP mode unless an ALARM is present. The WATCHDOG TIMER ensures that the MAIN CONTROLLER itself is working properly. If not, it initiates a reset to the MAIN CONTROLLER. This circuit also monitors the various inputs and determines which one should be permitted to pass through the mixer to the output. This decision is made based on a pre-determined priority schedule.

Figure 17:
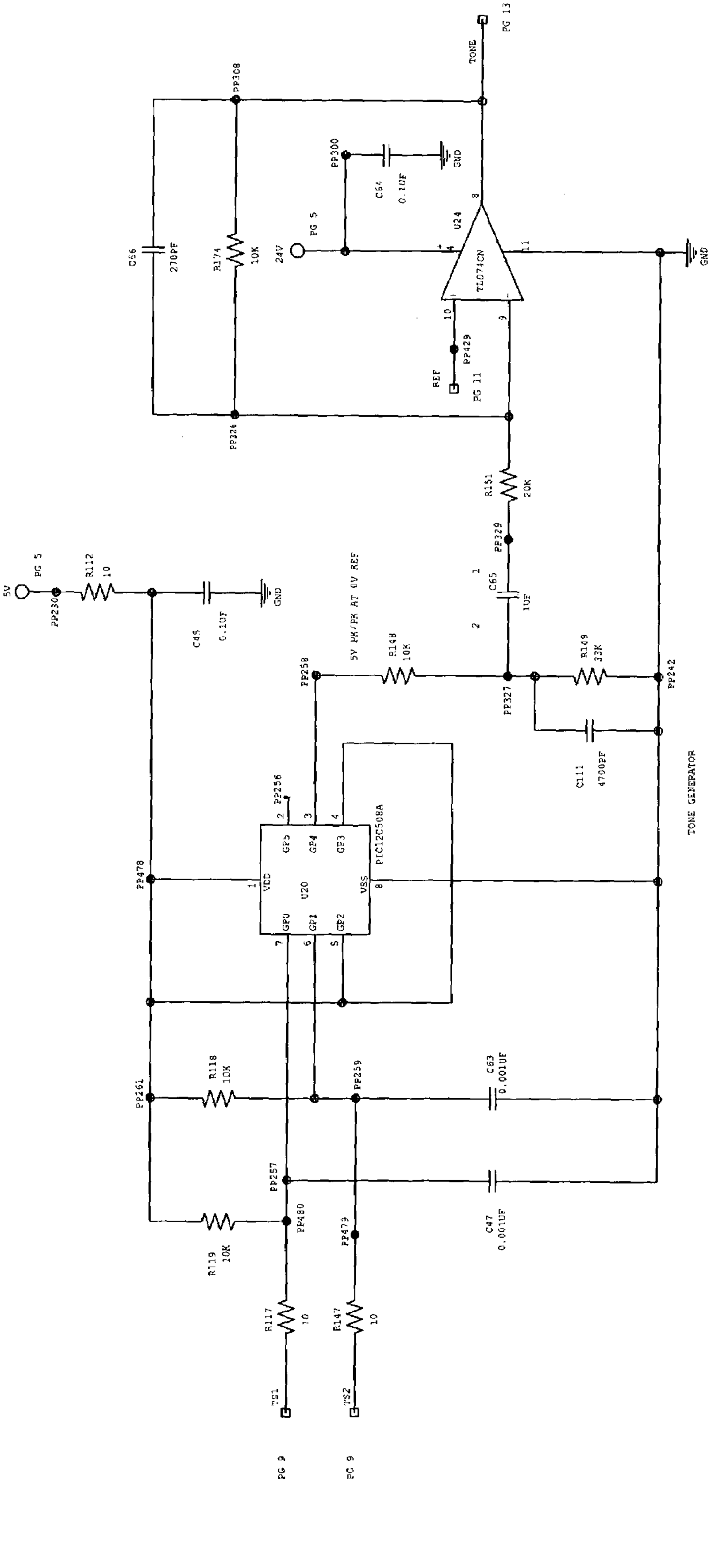
FIG. 17 illustrates a schematic diagram of a voice evacuation panel (SP 40/2) tone generator circuit of the present invention.

FIG. 17 illustrates a tone generator circuit. In one embodiment, this circuit accepts a command from the main microcontroller (U14) and accordingly outputs one of four tones to the mixer. The four tones are a 20 kHz-supervision tone, code 3, slow whoop, and bell. In the absence of an audio input, this circuit provides an audio tone burst (20 kHz tone) used to verify that the amplifier is still functioning properly. If the tone is not detected in the AUDIO OUTPUT CIRCUIT, a TROUBLE will be reported.

Figure 18:
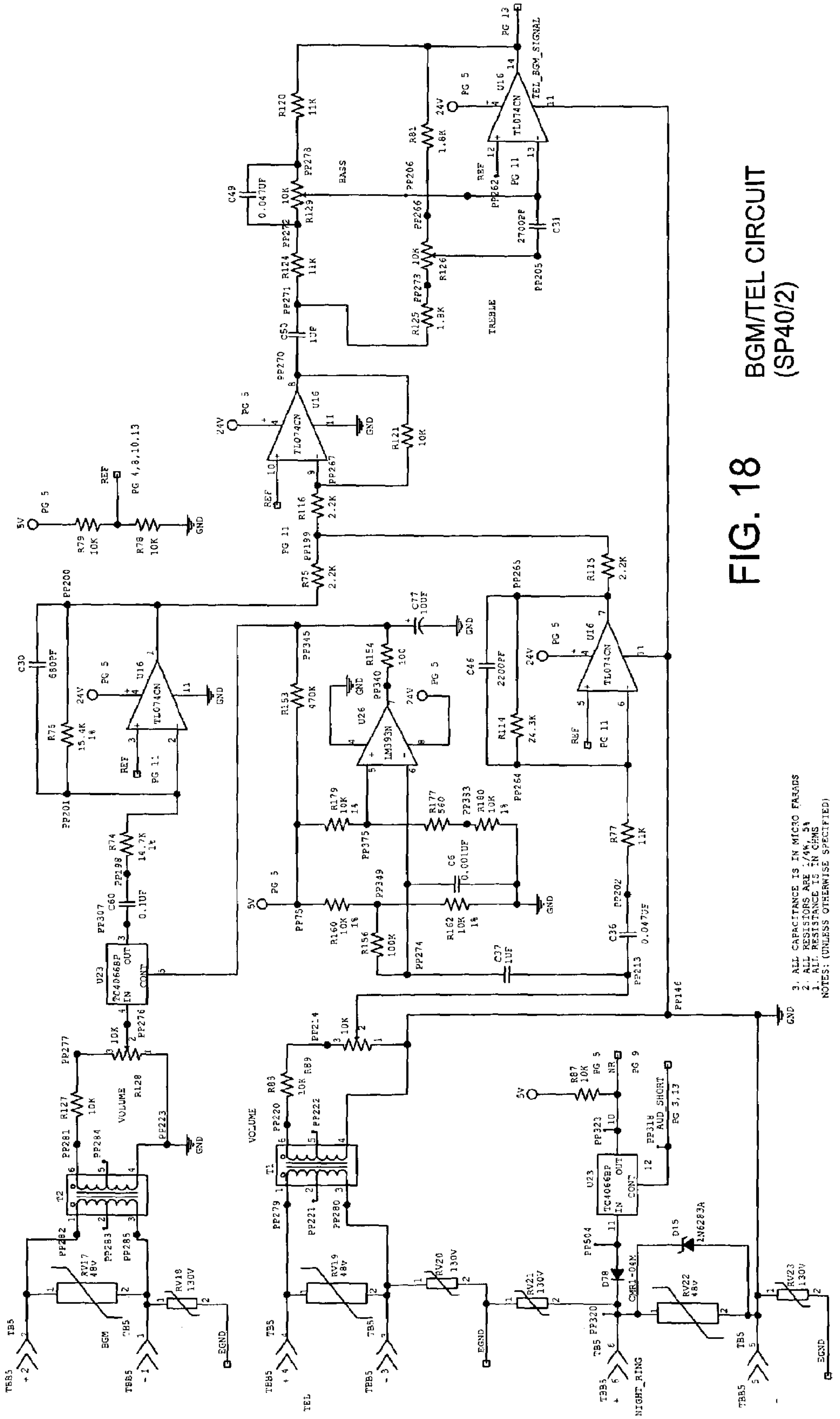
FIG. 18 illustrates a schematic diagram of a voice evacuation panel (SP 40/2) BGM/TEL circuit of the present invention.

FIG. 18 illustrates a BGM/TEL circuit. In one embodiment, this circuit accepts 3 types of inputs: Background Music (BGM), Telephone(TEL), and Night Ringer (NR). Providing a Contact Closure on the NR input will initiate the Bell tone from the tone generator circuit. The TEL input is obtained from a telephone circuit for live telephone paging. The BGM input is obtained from a line-level audio source. There are Volume adjustments and tone controls (Bass and Treble) for the BGM and TEL inputs. Amplification and filtering is also applied to the BGM and TEL inputs.

Figure 19:
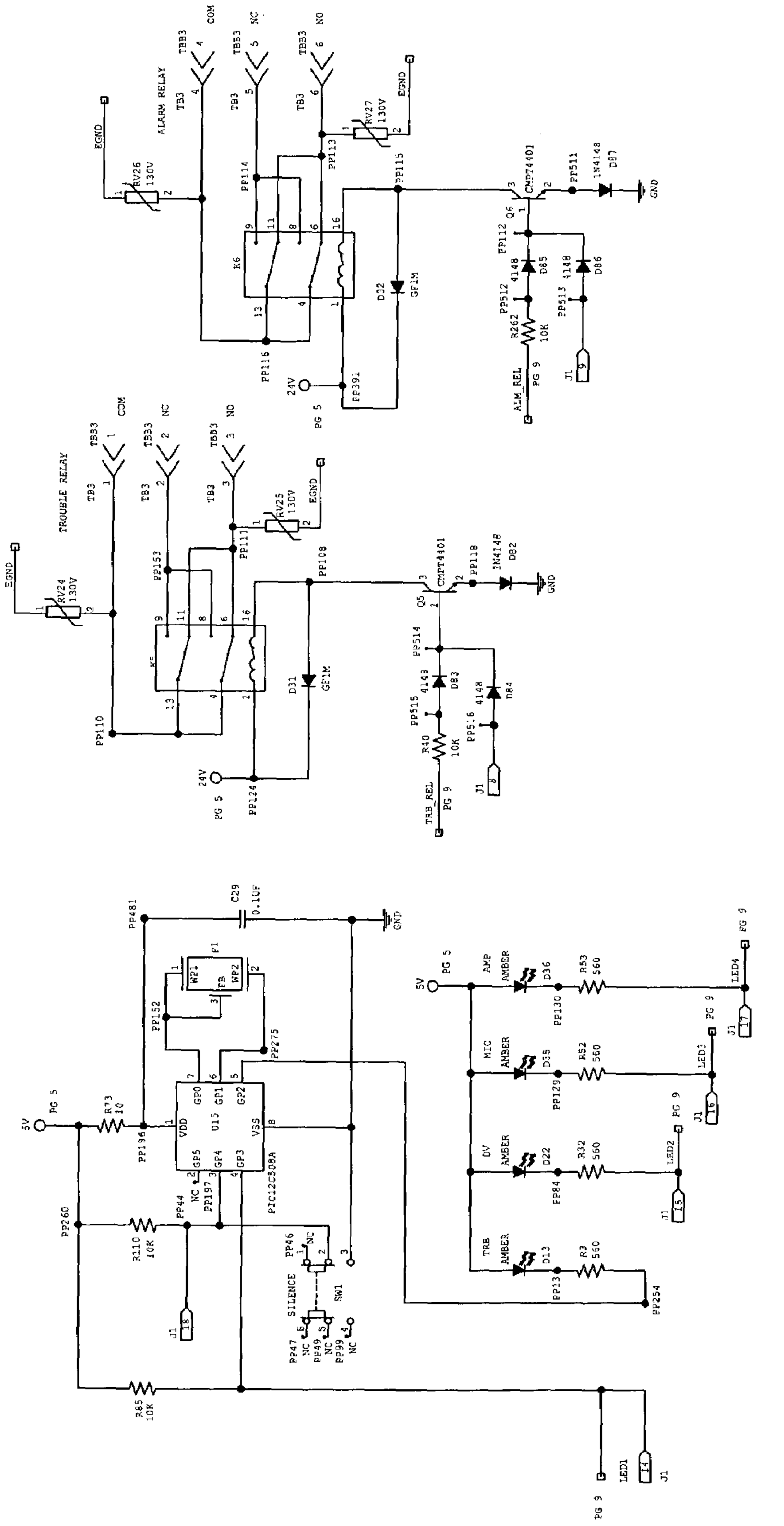
FIG. 19 illustrates a schematic diagram of a voice evacuation panel (SP 40/2) status circuit of the present invention.

FIG. 19 illustrates a status circuit. In one embodiment, this circuit contains three parts: Trouble Relay, Alarm Relay, and Audible Trouble. When an ALARM is active the relay (K6) will transfer. When any TROUBLE is detected the relay (K5) will transfer and the piezo (P1) will sound. The audible trouble notification can be silenced by close switch (SW1) momentarily. This circuit also contains LED's that are illuminated during different trouble conditions.

Figure 20:
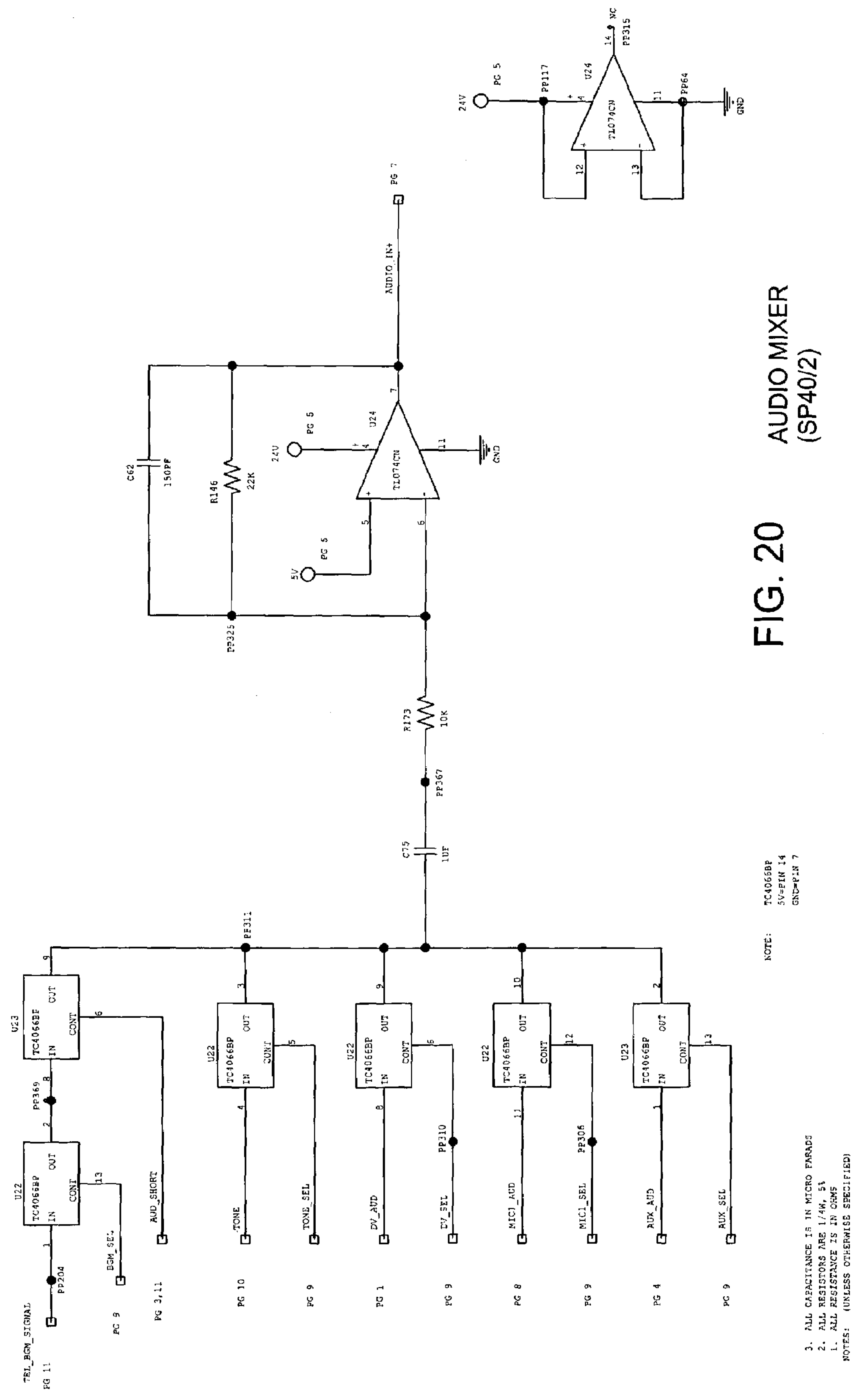
FIG. 20 illustrates a schematic diagram of a voice evacuation panel (SP 40/2) audio mixer of the present invention.

FIG. 20 illustrates an audio mixer circuit. In one embodiment, this circuit allows audio from one or more inputs to pass into the amplifier and to the AUDIO OUTPUT. The main microcontroller provides the signal to the audio mixer that determines which inputs to pass. This circuit is also a pre-amp and filter.

Figure 21:
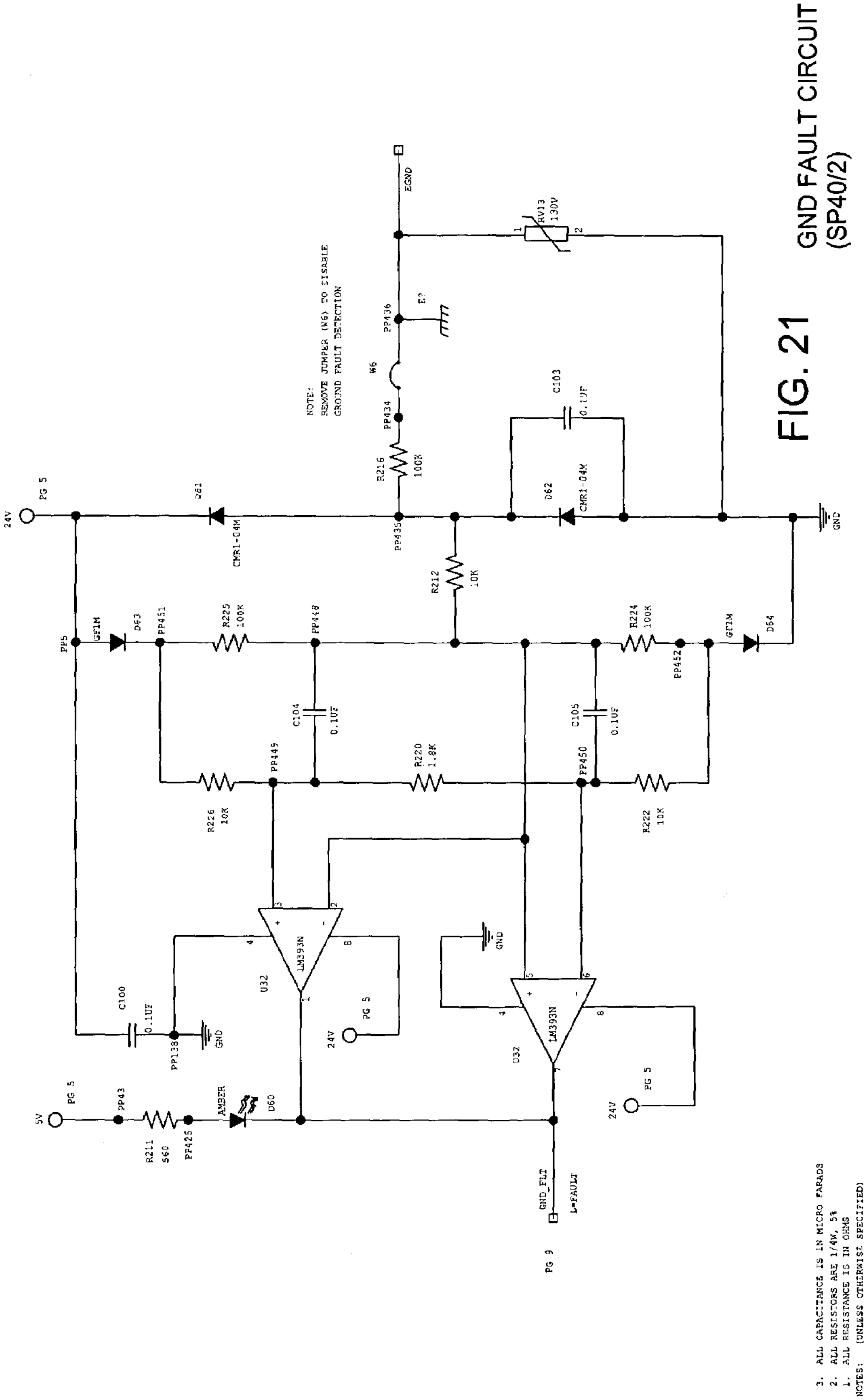
FIG. 21 illustrates a schematic diagram of a voice evacuation panel (SP 40/2) GND fault circuit of the present invention.

FIG. 21 illustrates a ground fault circuit. This is essentially a window comparator that tests for a DC level. If an output is accidentally connected to Earth Ground, a DC level will be applied to the ground and will be detected by this circuit. As a result of an unwanted ground, LED D60 will light to indicate there is a GROUND FAULT and TROUBLE will be reported. Removing Jumper W6 disables this circuit.

Figure 22:
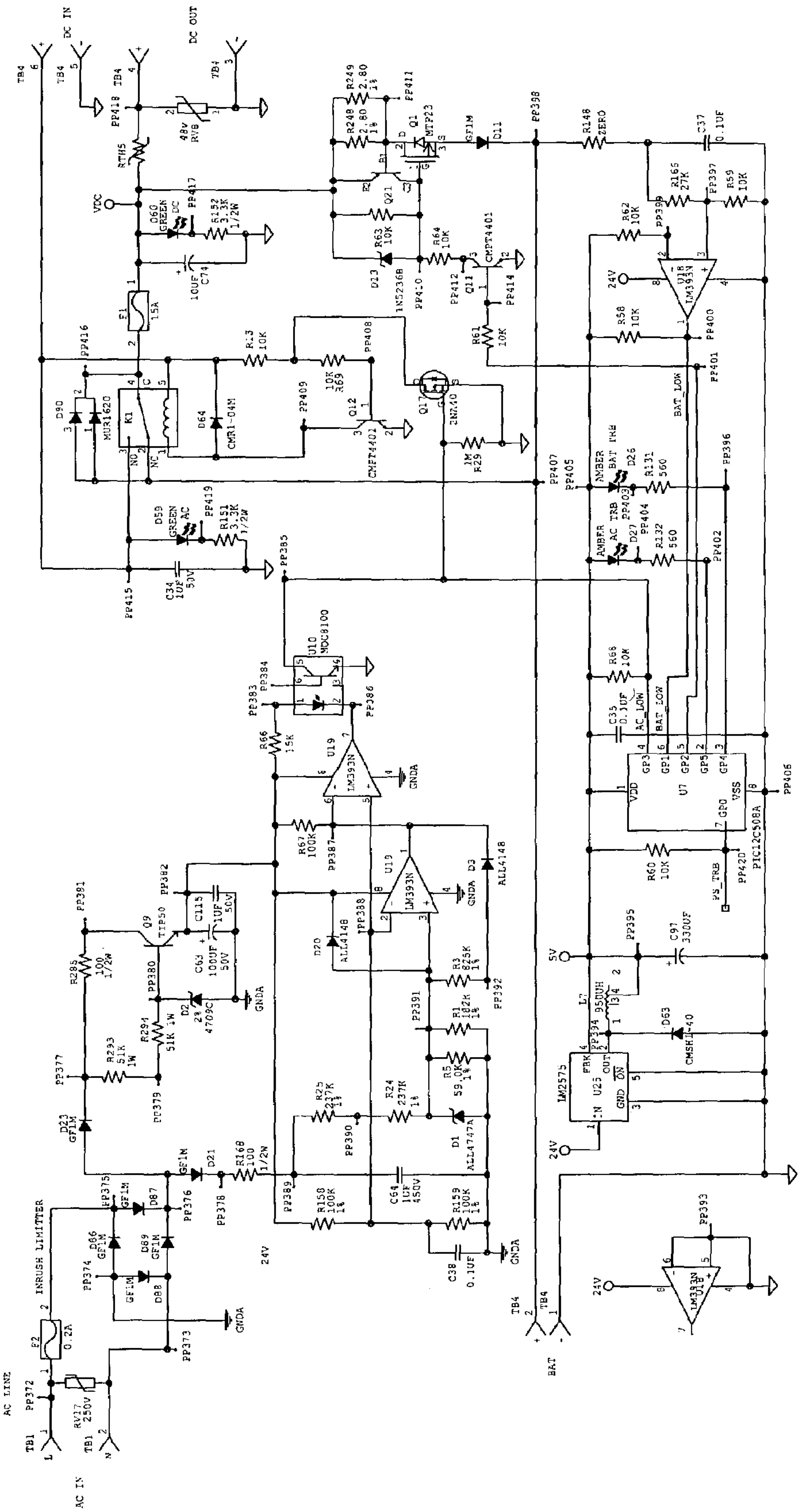
FIG. 22 illustrates a schematic diagram of an audio booster (SPB-160) audio booster power circuits of the present invention.
Figure 23:
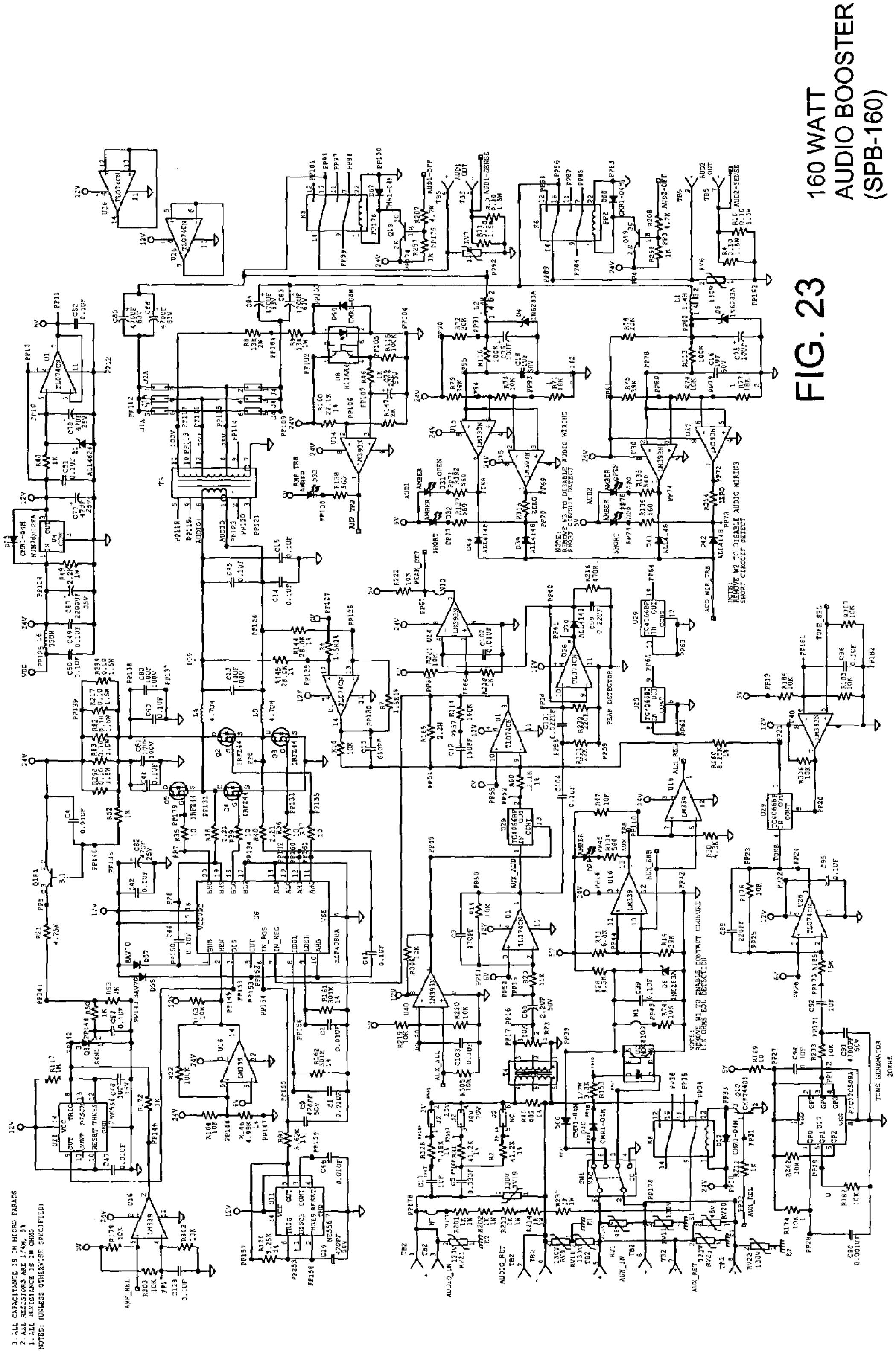
FIG. 23 illustrates a schematic diagram of an 160-watt audio booster (SPB-160) of the present invention.
Figure 23A:
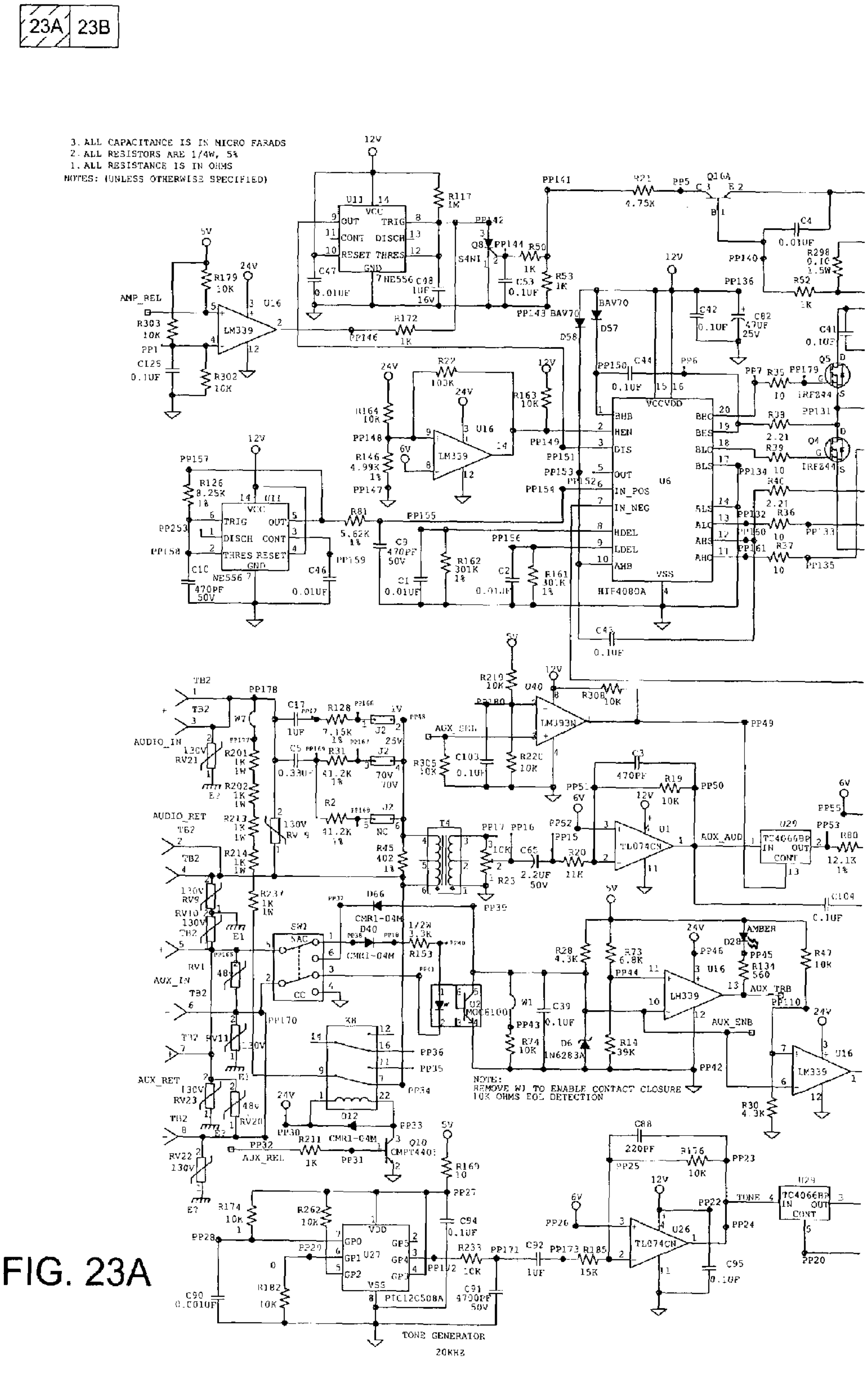
FIG. 23*a* illustrates a first portion of the schematic diagram of FIG. 23.
Figure 23B:
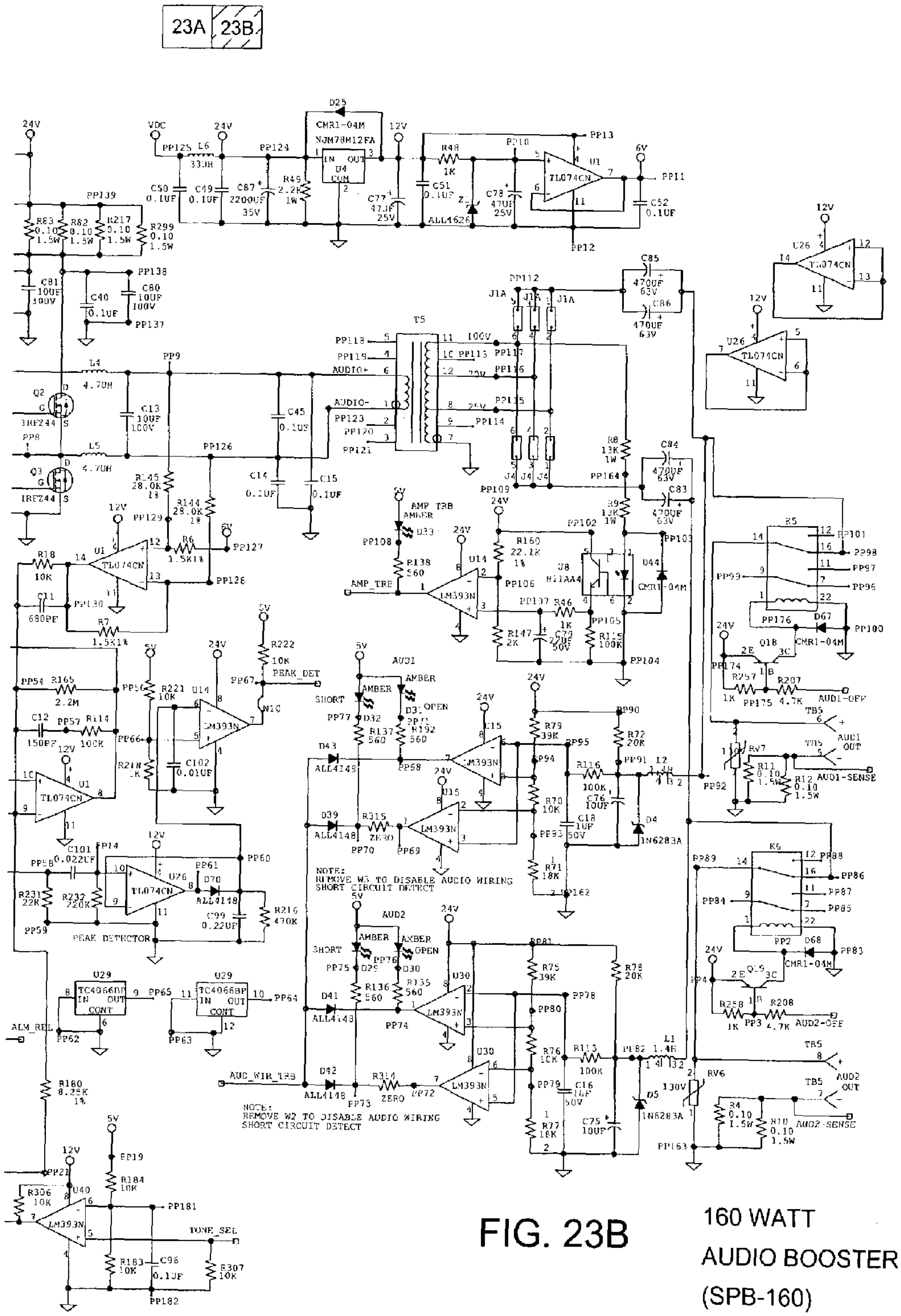
FIG. 23*b* illustrates a second portion of the schematic diagram of FIG. 23.
Figure 24:
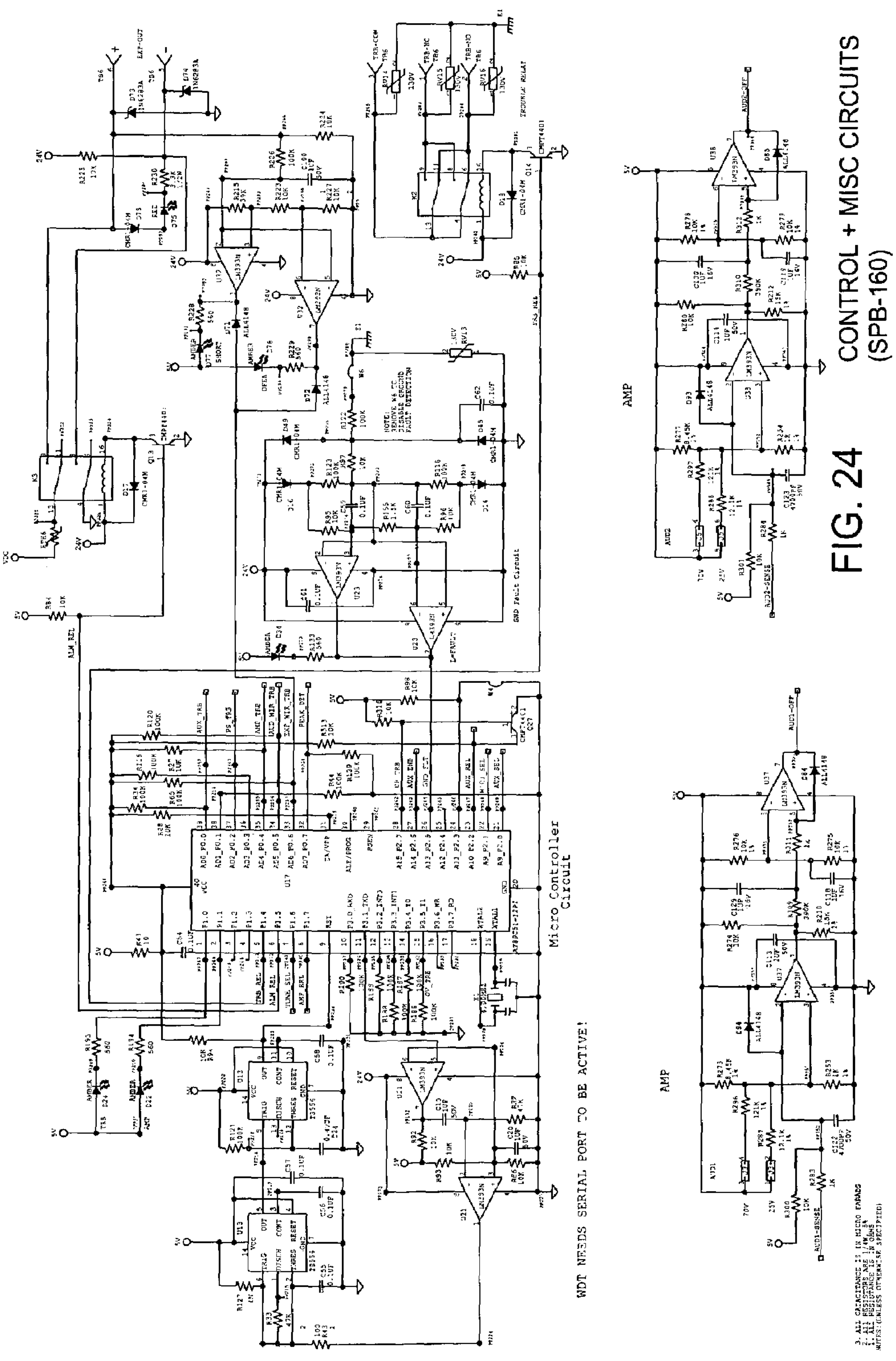
FIG. 24 illustrates a schematic diagram of an audio booster (SPB-160) control and misc. circuits of the present invention.
Figure 24A:
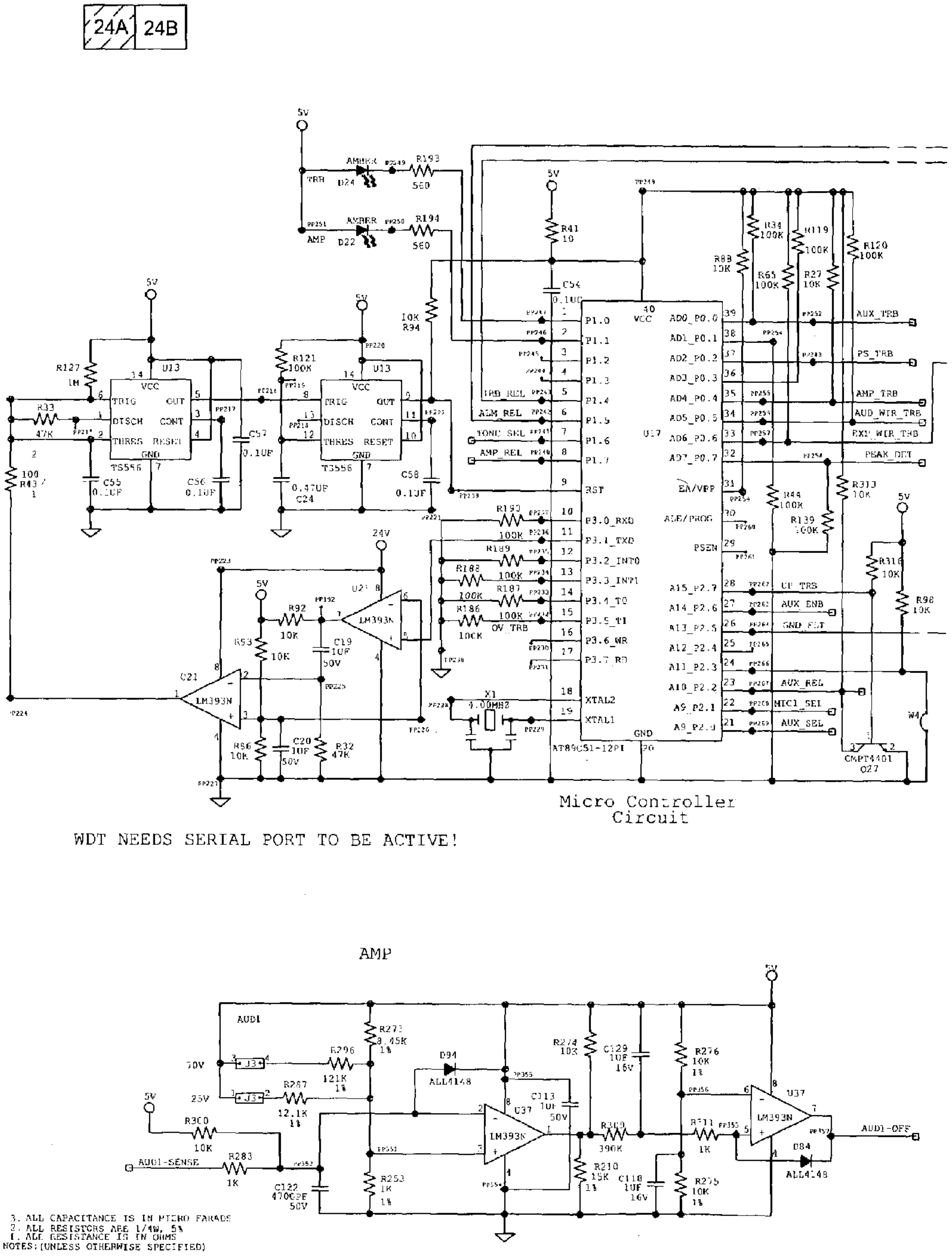
FIG. 24*a* illustrates a first portion of the schematic diagram of FIG. 24.
Figure 24B:
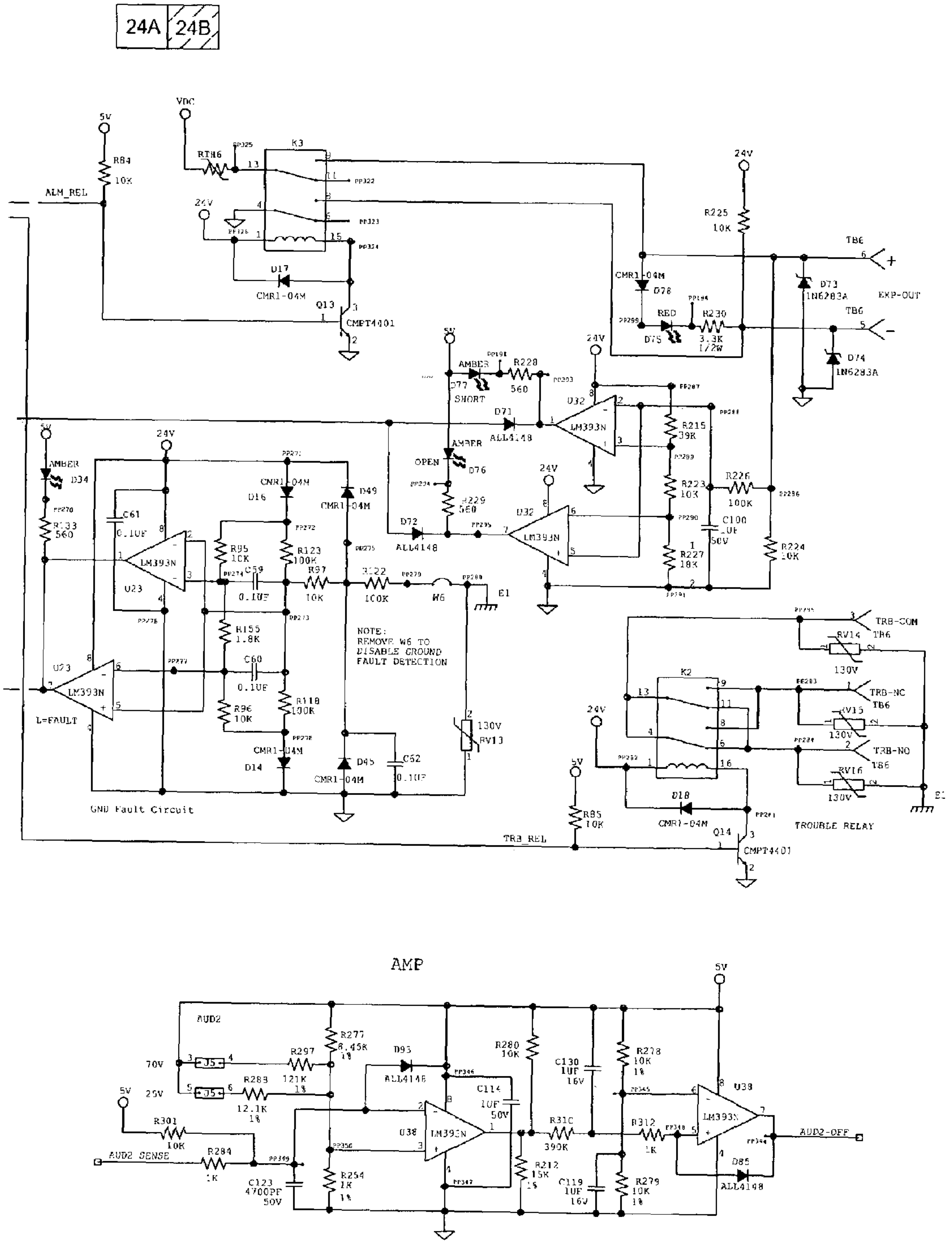
FIG. 24*b* illustrates a second portion of the schematic diagram of FIG. 24.

FIGS. 22-24 are alternate illustrative schematic diagrams for the audio booster. For example, FIGS. 22-24 collectively form a particular implementation of an audio booster of the present invention. Namely, various modules and circuits as disclosed above can be adapted or changed to form a particular booster. For example, if strobe power amplification is not necessary, this feature and its associated circuitry can be omitted in the audio booster.

Although various embodiments which incorporate the teachings of the present invention have been shown and described in detail herein, those skilled in the art can readily devise many other varied embodiments that still incorporate these teachings.

What is claimed is:

1. A notification system, said system comprising:

a notification panel for generating an audio signal;

a first audio booster, deployable remotely from said notification panel along a circuit, for receiving said audio signal and for amplifying a power of said audio signal; and at least one notification appliance for broadcasting said amplified audio signal, wherein said first audio booster appears to said notification panel as one of said at least one notification appliance.

2. The notification system of claim 1, wherein said first audio booster is supervised for failure or trouble conditions.

3. The notification system of claim 1, wherein said first audio booster appears to said notification panel as one of said at least one notification appliance by drawing a minimal amount of power from said notification panel.

4. The notification system of claim 1, wherein a notification appliance of said at least one notification appliance that is deployed between said notification panel and said first audio booster receives power from said notification panel, and wherein a notification appliance of said at least one notification appliance that is deployed after said first audio booster receives power from said first audio booster.

5. The notification system of claim 1, further comprising:

means for providing an end of line device.

6. The notification system of claim 5, wherein said means for providing an end of line device is a resistor.

7. The notification system of claim 5, wherein said means for providing an end of line device allows said notification panel to detect an open circuit condition.

8. The notification system of claim 5, wherein said means for providing an end of line device allows said notification panel to detect a short circuit condition.

9. The notification system of claim 5, wherein said means for providing an end of line device allows said notification panel to detect at least one of: a ground fault, battery trouble, a wire-to-wire short, an output audio circuit, an AC failure, an amplifier trouble, and an input-contact closure of said audio booster operating in a battery back-up mode.

10. The notification system of claim 9, wherein said notification panel upon detecting said first audio booster operating in a battery back-up mode will suspend a secondary operation and will only forward an emergency message.

11. The notification system of claim 10, wherein said secondary operation comprises at least one of: providing background music, telephone paging and night ring.

12. The notification system of claim 5, wherein said notification panel, said first audio booster and said at least one notification appliance are deployed using at least four-wires.

13. The notification system of claim 12, further comprising:

a second audio booster for receiving said audio signal and for amplifying said power of said audio signal.

14. The notification system of claim 13, wherein said means for providing an end of line device allows said notification panel to detect at least one of said audio boosters operating in a battery back-up mode.

15. The notification system of claim 13, wherein said notification panel provides a signal to said first and second audio boosters to indicate whether a current message is an emergency message or a non-emergency message.

16. The notification system of claim 1, further comprising:

a second audio booster for receiving said audio signal and for amplifying said power of said audio signal.

17. The notification system of claim 16, wherein a notification appliance of said at least one notification appliance that is deployed after said second audio booster receives power from said second audio booster.

18. The notification system of claim 1, wherein said notification panel, said first audio booster and said at least one notification appliance are deployed using at least two-wires.

19. A method for providing notification messages, said method comprising the steps of:

a) providing a notification panel for generating an audio signal;

b) providing a first audio booster, deployable remotely from said notification panel along a circuit, for receiving said audio signal and for amplifying a power of said audio signal; and c) providing at least one notification appliance for broadcasting said amplified audio signal; wherein said first audio booster appears to said notification panel as one of said at least one notification appliance.

20. The method of claim 19, wherein said first audio booster is supervised for failure or trouble conditions.

21. The method of claim 19, wherein said first audio booster appears to said notification panel as one of said at least one notification appliance by drawing a minimal amount of power from said notification panel.

22. The method of claim 19, wherein a notification appliance of said at least one notification appliance that is deployed between said notification panel and said first audio booster receives power from said notification panel, and wherein a notification appliance of said at least one notification appliance that is deployed after said first audio booster receives power from said first audio booster.

23. The method of claim 19, further comprising the step of:

d) providing an end of line device.

24. The method of claim 23, wherein said end of line device is a resistor.

25. The method of claim 23, wherein said end of line device allows said notification panel to detect an open circuit condition.

26. The method of claim 23, wherein said end of line device allows said notification panel to detect a short circuit condition.

27. The method of claim 23, wherein said end of line device allows said notification panel to detect said audio booster operating in a battery back-up mode.

28. The method of claim 27, further comprising the step of:

e) suspending a secondary operation and only forwarding emergency messages upon detecting said first audio booster operating in said battery back-up mode.

29. The method of claim 28, wherein said secondary operation comprises at least one of: providing background music, providing telephone paging and providing night ring.

30. The method of claim 23, wherein said notification panel, said first audio booster and said at least one notification appliance are deployed using at least four-wires.

31. The method of claim 30, further comprising the step of:

e) providing a second audio booster for receiving said audio signal and for amplifying said power of said audio signal.

32. The method of claim 31, wherein said end of line device allows said notification panel to detect at least one of said audio boasters operating in a battery back-up mode.

33. The method of claim 31, further comprising the step of:

f) providing a signal to said first and second audio boosters to indicate whether a current message is an emergency message or a non-emergency message.

34. The method of claim 19, further comprising the step of:

d) providing a second audio booster for receiving said audio signal and for amplifying said power of said audio signal.

35. The method of claim 34, wherein a notification appliance of said at least one notification appliance that is deployed after said second audio booster receives power from said second audio booster.

36. The method of claim 19, wherein said notification panel, said first audio booster and said at least one notification appliance are deployed using at least two-wires.

* * * * *